US007386833B2

(12) United States Patent
Granny et al.

(10) Patent No.: US 7,386,833 B2
(45) Date of Patent: Jun. 10, 2008

(54) POLYMORPHIC COMPUTATIONAL SYSTEM AND METHOD IN SIGNALS INTELLIGENCE ANALYSIS

(75) Inventors: Nicola V. Granny, Bloomington, IN (US); Martina M. Brisudova, Bloomington, IN (US)

(73) Assignee: Mentor Graphics Corp., Wilsonville, OR (US)

( * ) Notice: Subject to any disclaimer, the term of this patent is extended or adjusted under 35 U.S.C. 154(b) by 730 days.

(21) Appl. No.: 10/653,998

(22) Filed: Sep. 4, 2003

(65) Prior Publication Data

US 2004/0044514 A1 Mar. 4, 2004

Related U.S. Application Data

(60) Provisional application No. 60/407,702, filed on Sep. 4, 2002, provisional application No. 60/407,703, filed on Sep. 4, 2002.

(51) Int. Cl.
*G06F 9/45* (2006.01)
(52) U.S. Cl. .................................. 717/109
(58) Field of Classification Search ................. 717/109
See application file for complete search history.

(56) References Cited

U.S. PATENT DOCUMENTS

| 5,036,473 | A | | 7/1991 | Butts et al. |
| 5,109,353 | A | | 4/1992 | Sample et al. |
| 5,596,704 | A | * | 1/1997 | Geddes et al. ............... 715/763 |
| 5,596,742 | A | | 1/1997 | Agarwal et al. |
| 5,684,970 | A | * | 11/1997 | Asuma et al. ............... 715/775 |
| 5,751,286 | A | * | 5/1998 | Barber et al. ............... 715/835 |
| 5,854,752 | A | | 12/1998 | Agarwal |
| 5,870,308 | A | | 2/1999 | Dangelo et al. |
| 5,946,219 | A | * | 8/1999 | Mason et al. ............... 716/16 |
| 6,009,531 | A | | 12/1999 | Selvidge et al. |
| 6,061,511 | A | | 5/2000 | Marantz et al. |
| 6,223,148 | B1 | | 4/2001 | Stewart et al. |
| 6,269,467 | B1 | | 7/2001 | Chang et al. |
| 6,279,146 | B1 | | 8/2001 | Evans et al. |
| 6,311,149 | B1 | | 10/2001 | Ryan et al. |
| 6,326,962 | B1 | * | 12/2001 | Szabo ........................ 715/762 |
| 6,421,817 | B1 | * | 7/2002 | Mohan et al. ............... 716/16 |

(Continued)

OTHER PUBLICATIONS

International Search Report issued Mar. 12, 2004 in Application No. PCT/US03/27467.

(Continued)

*Primary Examiner*—John Chavis
(74) *Attorney, Agent, or Firm*—Banner & Witcoff, Ltd.

(57) ABSTRACT

Configuration software is used for generating hardware-level code and data that may be used with reconfigurable/polymorphic computing platforms, such as logic emulators, and which may be used for conducting signals intelligence analysis, such as encryption/decryption processing, image analysis, etc. A user may use development tools to create visual representations of desired process algorithms, data structures, and interconnections, and system may generate intermediate data from this visual representation. The Intermediate data may be used to consult a database of predefined code segments, and segments may be assembled to generate monolithic block of hardware syhthesizable (RTL, VHDL, etc.) code for implementing the user's process in hardware. Efficiencies may be accounted for to minimize circuit components or processing time. Floating point calculations may be supported by a defined data structure that is readily implemented in hardware.

22 Claims, 20 Drawing Sheets

U.S. PATENT DOCUMENTS

| | | |
|---|---|---|
| 6,424,968 B1 | 7/2002 | Broster et al. |
| 6,442,732 B1 | 8/2002 | Abramovici et al. |
| 6,484,304 B1 | 11/2002 | Ussery et al. |
| 6,584,601 B1 | 6/2003 | Kodosky et al. |
| 6,608,638 B1 | 8/2003 | Kodosky et al. |
| 6,611,952 B1 | 8/2003 | Prakash et al. |
| 6,651,102 B2 | 11/2003 | Baker et al. |
| 6,934,667 B2 * | 8/2005 | Kodosky et al. ................ 703/2 |
| 6,971,066 B2 * | 11/2005 | Schultz et al. .............. 715/771 |
| 7,085,702 B1 * | 8/2006 | Hwang et al. ................. 703/15 |
| 7,110,936 B2 * | 9/2006 | Hiew et al. ................... 703/22 |
| 7,134,090 B2 * | 11/2006 | Kodosky et al. ............ 715/769 |
| 2002/0055834 A1 * | 5/2002 | Andrade et al. .............. 703/27 |
| 2002/0133788 A1 | 9/2002 | Waters et al. |
| 2002/0186246 A1 | 12/2002 | Burnette et al. |
| 2003/0033039 A1 | 2/2003 | Gutberlet et al. |
| 2003/0038842 A1 * | 2/2003 | Peck et al. ................... 345/763 |
| 2003/0184580 A1 * | 10/2003 | Kodosky et al. ............ 345/734 |

OTHER PUBLICATIONS

International Search Report issued Dec. 29, 2003 in Application No. PCT/US03/27468.

* cited by examiner

POLYMORPHIC COMPUTATIONAL SYSTEM AND METHOD IN SIGNALS INTELLIGENCE ANALYSIS

The present application claims priority, under 35 U.S.C. 119(e), to U.S. provisional application Ser. No. 60/407,703, entitled "A Device, Methodology and Development Environment for the Modeling of Physical Phenomena Within a Reconfigurable Computational Platform," filed Sep. 4, 2002, and U.S. provisional application Ser. No. 60/407,702, entitled "A Device, Methodology and Application Development for Signals Intelligence Using a Reconfigurable Computational Platform," filed Sep. 4, 2002, the disclosures of which are both hereby incorporated by reference.

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates generally to the field of reconfigurable computing platforms. The reconfigurable nature of these platforms indicates that their physical hardware need not be static, and that it may be readily reconfigured after manufacture. Such platforms are typically made up from single devices such as field-programmable gate arrays (FPGAs), collections of FPGA's assembled into a fabric of reconfigurable hardware or highly complex logic emulation systems. Some embodiments are particularly advantageous in logic emulation systems, which may be a large-scale platform with reconfigurable logic such as the V Station family of products offered by Mentor Graphics Corporation. In particular, some embodiments of the present invention relate to user interface systems and methods for simplifying configuration of these reconfigurable platforms. Other aspects relate to software design concepts for configuration of polymorphic computational systems, which broadly refers to systems employing one or more reconfigurable computing platforms or emulation systems that may treat an entire problem holistically, involving not only the reconfigurable platform, but also its related software, methods, and practices. Still further aspects relate to using reconfigurable (and/or polymorphic) computing platforms to provide an easy-to-use, dynamic development environment that may be used by even those unfamiliar with computer programming and/or FPGA or emulation system programming. Some embodiments may be used to facilitate signals intelligence analysis, such as the decryption/encryption of data, or the detection of predefined images in satellite photographs.

BACKGROUND OF THE INVENTION

The power of modern computing can hardly be overstated. Calculations that once took anywhere from hours to months to manually perform can be accomplished literally in the blink of an eye. Calculation-intensive tasks are now accomplished in a mere fraction of the time previously required, and with each passing year computing power is greater than before. These days, the power of computing is even applied to the process of making computers themselves, a self-fulfilling process that will inevitably lead to more powerful computers.

One tool that is often used in the design of integrated circuits is the logic emulation system (emulator). The emulator may be used to simulate hardware circuitry, in real time, prior to the circuit's formal manufacturing process. The circuit's design, once emulated, can be analyzed and tested to identify any design errors. Since the emulator (by design) is reconfigurable, errors in a circuit's design, once detected, may be corrected by reconfiguring the emulator. In this manner, a designer can be confident in a particular design even before a single actual component is manufactured.

Although the emulator has gained wide acceptance in certain fields (specifically electronic design automation), the full potential for this technology has not yet been reached. This is partly due to the complexity and difficulty in writing the programs and download files that are necessary for configuring an emulator—those outside of the circuit design art have, until now, simply avoided using the emulator for tasks other than hardware functional and performance verification.

The inventors of the present application have realized, however, that the emulator possesses great promise in computing power. The emulator can be configured to create dedicated hardware for executing any desired process or algorithm, and this configuration may be optimized such that the process is carried out at hardware speeds—much faster than programs written for general purpose computers. The potential uses are limitless, as emulators may be used by cryptographers, geneticists, mathematicians, image analysis experts, and in any other area where programs are executed on general purpose computers.

To a cryptographer, however, the typical emulator may as well be a ship's anchor. Writing typical computer programs or download files for an emulator takes special skill in computer programming and logic synthesis (such as knowledge of various hardware description languages such as Verilog, Verilog Hardware Description Language (VHDL) and/or Register Transfer Logic (RTL)), and may require significant amounts of time to write. For example, working exclusively in RTL and/or VHDL, a simple circuit might require a skilled semiconductor designer no less than two days to write the code, and another full day to verify its functionality. Many of us, cryptographers included, simply may not have the time or ability to do such coding. Accordingly, there is a general need for improved computing power, and if emulators (or other large scale "fabrics" of reconfigurable logic) are to be used to offer this power, there is a specific need for a simpler, user-friendly way to generate the complex code and download files necessary to program today's reconfigurable platforms.

DETAILED DESCRIPTION OF ILLUSTRATIVE EMBODIMENTS

Figure 1:
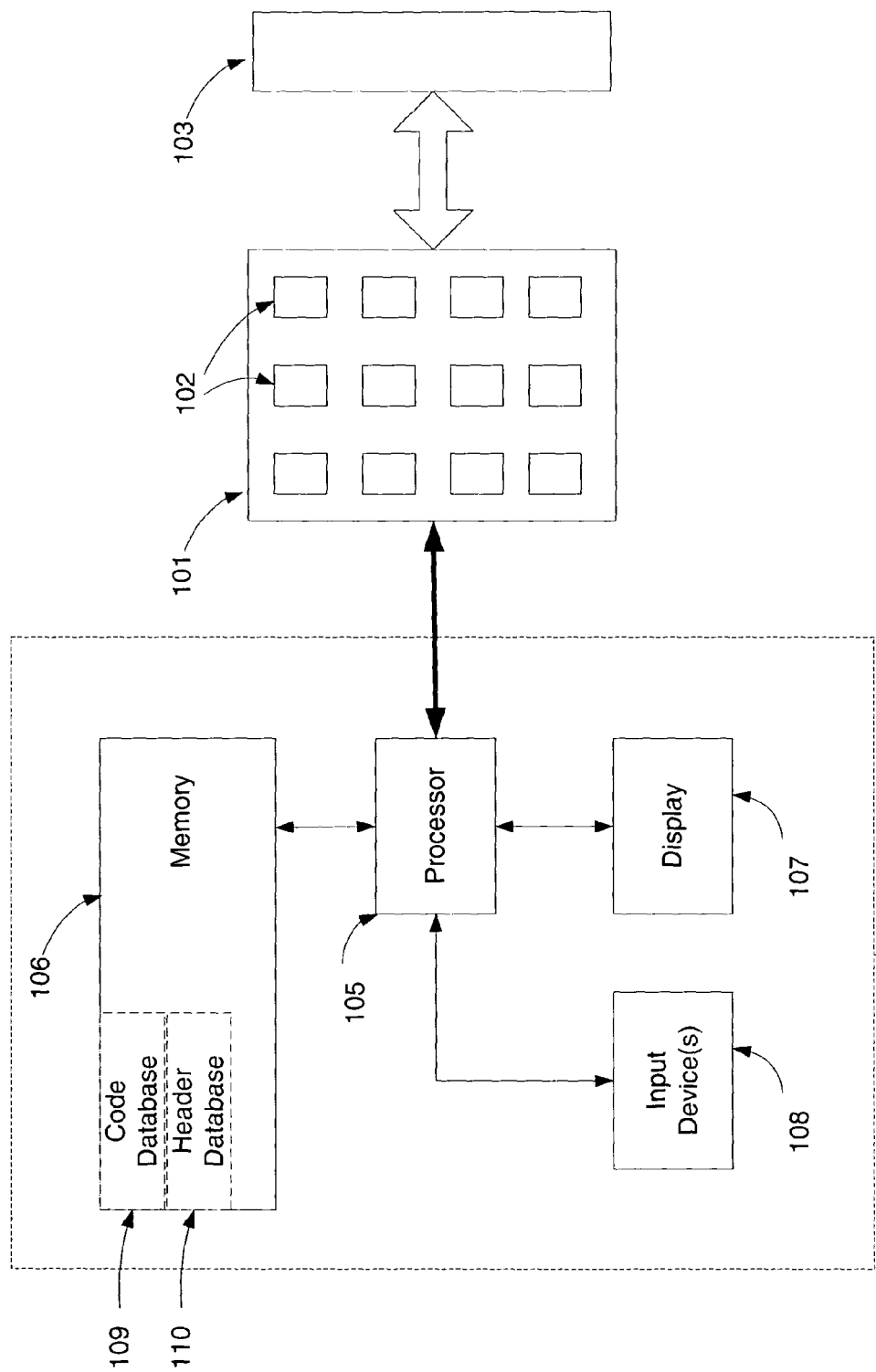
FIG. 1 illustrates an example of a computing environment in which one or more embodiments of the present invention may be implemented.

FIG. 1 illustrates a computing environment in which one or more embodiments of the present invention may be used. This environment uses a reconfigurable computing device 101, which may be an emulator, although other forms of reconfigurable computing platforms may work equally well. Emulator 101 contains an array of reconfigurable logic elements 102, each of which includes circuitry that allows the particular logic element 102 to perform predefined functions supporting or implementing a portion of the desired algorithm. The emulator 101 may also include circuitry, such as a interconnect 103, that performs interconnections between the various logic elements 102 to form a larger circuit. Other approaches to interconnections are also possible, such as on-chip wiring, circuitry, using logic elements 102 to control interconnectivity, and/or time division multiplexing of the interconnections. Some approaches to such interconnections, and other features that may be pertinent to the disclosure herein, are described in U.S. Pat. Nos. 5,036,473; 5,109,353; 5,596,742; 5,854,752; 6,009,531; 6,061,511; and 6,223,148, the disclosures of which are hereby incorporated by reference. Using reconfigurable computing platforms, one may take advantage of their massively parallel nature in order to partition a problem to be solved into manageable elements with fast and reliable communication pathways, allowing them to be solved by the hardware. Circuits and algorithms may be implemented on the platforms in a parallel fashion and executed at hardware speeds, which may be several orders of magnitude faster than traditional general-purpose computers (depending upon the nature of the application).

A user may configure the logic elements 102 and their interconnections by using computer workstation 104. Workstation 104 may include one or more processors 105, which may execute instructions from software contained in one or more computer-readable memories 106 to perform the various steps and functions described herein. Workstation 104 may also include one or more displays 107, which may be used to provide visual information to a user, as well as one or more input devices 108 to allow user input. Any form of display and input device may be used, although in some embodiments, display 107 is sensitive to a stylus input device 108. For example, display 107 may be touch-sensitive, or may electromagnetically detect the presence of an input device 108, which may be a hand-held stylus, pen, or other type of pointing device. Embodiments of the present invention may be implemented using commercially-available emulation hardware, such as the V-Station/5M, V-Station/15M and V-Station/30M emulation systems offered by Mentor Graphics Corporation, and may be used with system compilers such as the Mentor Graphics VLE 4.0.3 and VLE 4.0.4, also offered by Mentor Graphics Corporation.

Figure 2:
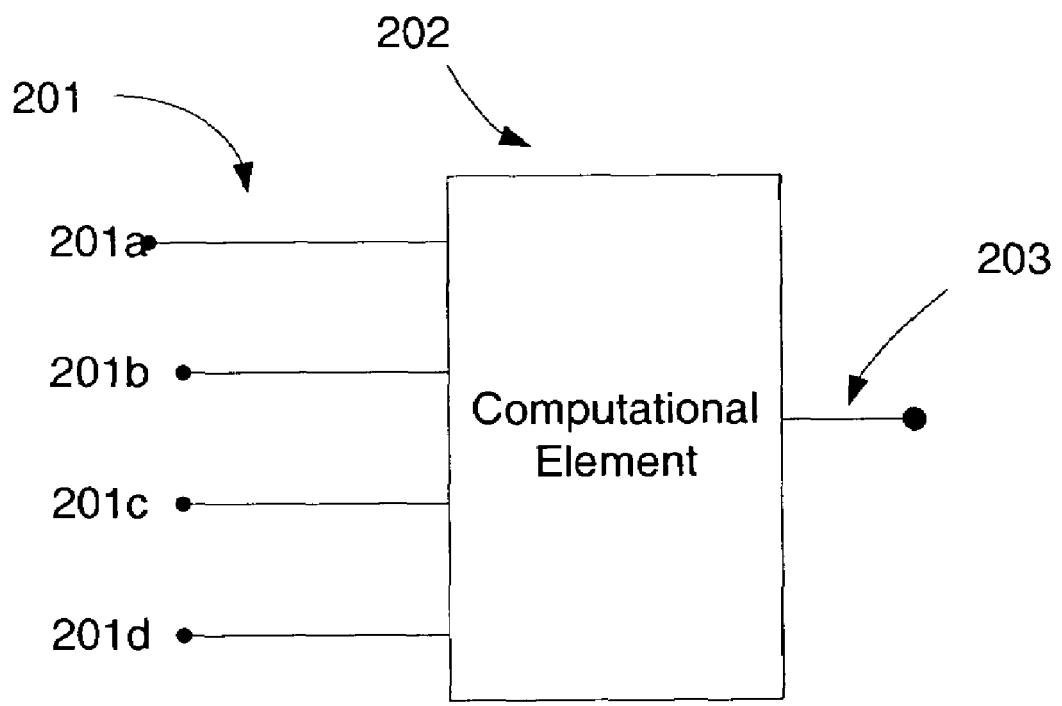
FIG. 2 illustrates an example of a configuration of a logic element in a reconfigurable computing platform.

FIG. 2 illustrates an example of a logic element 102, which may be referred to as a common logic block (CLB) in some embodiments. As shown in FIG. 2, a particular logic element or CLB 102 may include a number of inputs 201. In some systems, a CLB 102 may receive 32 to 64 inputs. CLB 102 may also include a reconfigurable computational element 202, which may include reconfigurable circuitry for performing a variety of predefined operations on one or more of inputs 201, and may be configured to perform one or more of these operations by downloading binary data files from host workstation 104. CLB 102 may present the output signal or signals as output 203, which in some embodiments may include 32 to 64 outputs. As will be discussed below, some embodiments of the present invention may be used to configure one or more CLB 102s to perform a complex table lookup implementing a behavioral model of a physical behavior.

Logic elements 102 may be implemented in a variety of different configurations, such as having different numbers of inputs or outputs. Similarly, while FIG. 1 depicts a single emulator 101, that emulator 101 may in turn be comprised of a plurality of smaller emulation circuit boards working in concert, and/or may be combined with other emulators in a collaborative arrangement. Other types of reconfigurable computing platforms, besides emulators, may also be used. Embodiments of the present invention may be used in any variety of platforms and configurations.

Before getting into details regarding the example embodiments, it will be helpful to understand the basics of several general steps that may be found in some embodiments of the present invention. In the first such general step, the user uses workstation 104 to access a graphical user interface (described below) to assemble a visual representation of a process using a collection of predefined graphical icons. These icons represent predefined algorithms, software functions, data structures, or the like. The user places these icons in a graphical workspace, and creates a number of interconnections between the icons to represent the transfer of information and/or control signals, thus effectively defining the flow of the desired process. In some embodiments, the user accomplishes this by simply drawing symbols on a display device using a pointing device. When the user has finished preparing the visual representation of the desired process, the system may enter the second general step. In the second step, the system may automatically analyze the various interconnected icons to construct computer code that will carry out the user's desired process. In some embodiments, this code may be a program of human-readable computer code (e.g., in the C, C++, Pascal, Delphi, ADA, Fortran, etc. computer language) that will carry out the user's process. To accomplish this, the system may store one or more databases in memory 106 containing program code segments corresponding to the various icons, as well as additional characteristic (e.g., header) information relating to the algorithms represented by the icons. The system may assemble these code segments according to their orientation in the visual representation. In further embodiments, the system may prepare a machine-readable version of the program code, such as in a Hardware Description Language (HDL) such RTL, Very large scale integration Hardware Description Language (VHDL—an industry standard tool for the description of electronic circuits in structural or behavioral frameworks) and Structural Verilog, or a downloadable binary file, that may be used to configure a reconfigurable computing device, such as emulator 101, to carry out the desired process in hardware. In preparing this machine-readable code, the system may automatically analyze the user's process to determine an efficient hardware configuration for carrying out the user's process. Through this process, a user who is relatively unfamiliar with the technical programming of a reconfigurable computing device may easily create a hardware component custom-tailored to implement the user's desired process. These general steps are discussed below in greater detail.

An Example Graphical User Interface (GUI)

Figure 3:
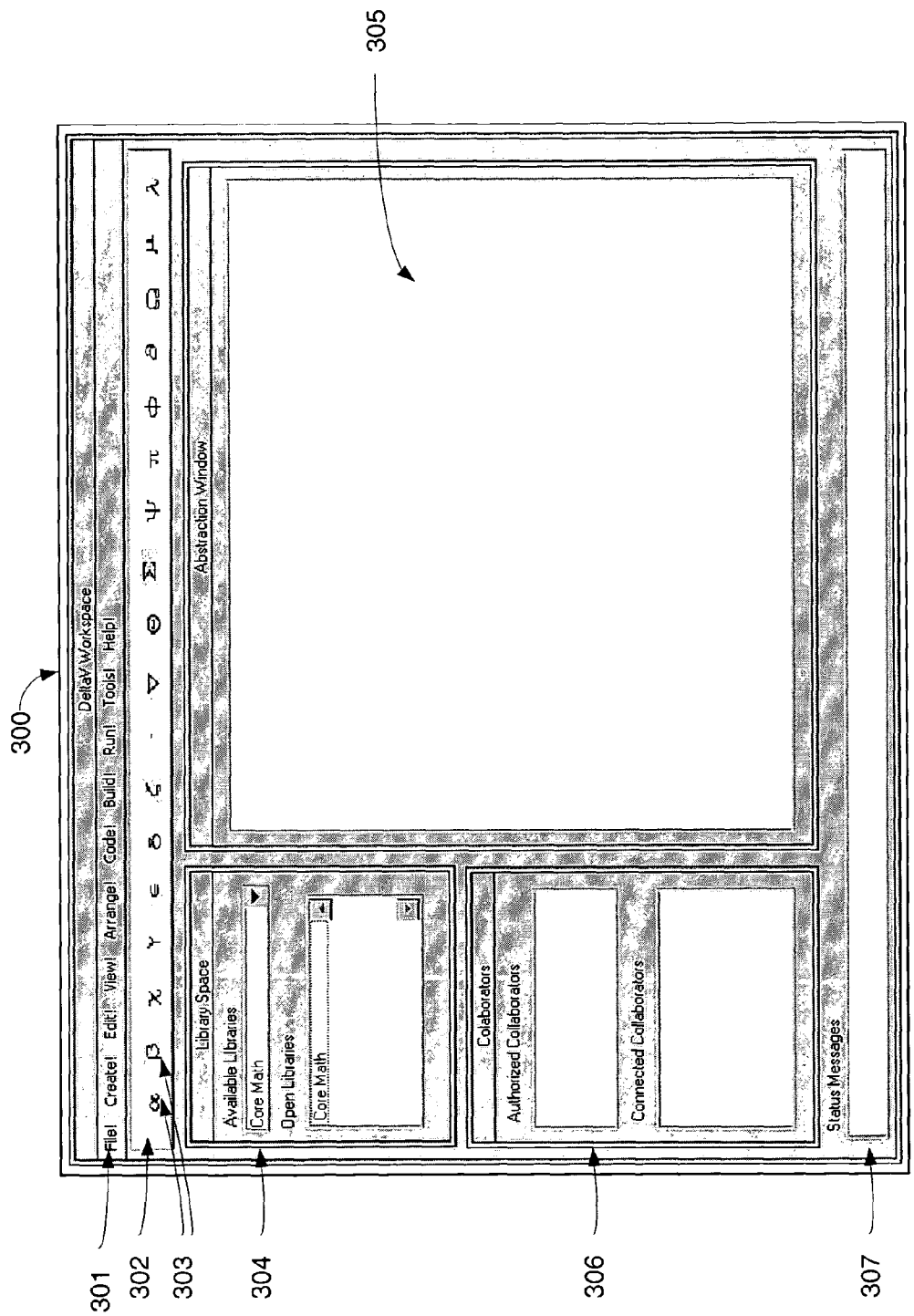
FIG. 3 depicts an example of a user interface that may be used in accordance with embodiments of the present invention to create a visual representation of a desired process.

FIG. 3 depicts an example user interface that may be used to create a visual representation of a desired process. This user interface may include an overall workspace 300 through which the user may graphically assemble an iconic representation of a particular process that the user wishes to implement in emulator 101 hardware circuitry. Workspace may include control features, such as menu bar 301, containing a number of control commands that the user may wish to enter. In some embodiments, the particular control features that are available are context sensitive, such that command options are only displayed and/or available for selection when they are contextually appropriate. Example functions are described further below in connection with FIG. 8.

Workspace 300 may include a Library Icon Panel 302 containing a number of library element icons 303 representing predefined algorithms that the user may use as "building blocks" to construct the desired process. Library elements may be any type of predetermined algorithm, such as a known mathematical function, a computer function, or a computer subroutine. The library element may also represent a previously-defined circuit that performs an algorithm or carries out some process.

Workspace 300 may also include a Library Space 304, which allows a user to manage the various icons 303 that are displayed in the Library Icon Panel 302. The various library element icons 303 may be organized by category and/or subject matter to simplify the process of locating a particular element. For example, icons corresponding to mathematical functions may be located together in one library, while other icons corresponding to predefined circuits may be located in another library. In the FIG. 3 example, Library Space 304 includes a pull-down menu of available libraries, and a listing of the various libraries that the user has already opened.

Workspace 300 may include an Abstraction Window 305, which may serve as the area in which the user assembles the visual representation of the desired process. The user does this by placing various icons in the Abstraction Window 305, and by defining relationships, such as data transfer and timing relationships, between the icons.

Workspace 300 may also include a Collaboration Panel 306. Collaboration may allow a number of individuals to simultaneously work on the same project using different computer terminals. In some embodiments, workspace 300 may be displayed on each of those computer terminals. One of the terminals may be given a proverbial "token," and may have control over workspace 300 while others may view the display as it is modified. Alternatively, multiple terminals may be given control over workspace 300, where the terminals simultaneously update the various displays to reflect the collaborators' changes. In some embodiments, different collaborators may work on different aspects of an overall project, and their individual computer terminal workspaces 300 may display different portions of the graphic algorithm. For example, one collaborator's workspace 300 may show an algorithm for calculating a first value, while another collaborator's workspace 300 may show a subsequent algorithm that uses the first value in a further calculation.

Collaboration Panel 306 may include an area identifying the various collaborators who are currently actively working on the workspace 300, and may also include an area identifying the various collaborators who are authorized to work on the same project.

Workspace 300 may also include an area, such as Status Messages Panel 307, in which status messages, context sensitive help, and/or other information may be provided to the user. For example, context-sensitive help messages may be dynamically displayed as the user positions a cursor or pointer over various parts of workspace 300. Such help messages may also be displayed in a pop-up window in proximity to the cursor or pointer, or the messages may be displayed across both the pop-up window and the Status Messages Panel 307. In some embodiments, the Status Messages Panel 307 may display the current status of various collaboration activities. Status Message Panel 307 may also be used to prompt the user for certain types of information.

Figure 4A:
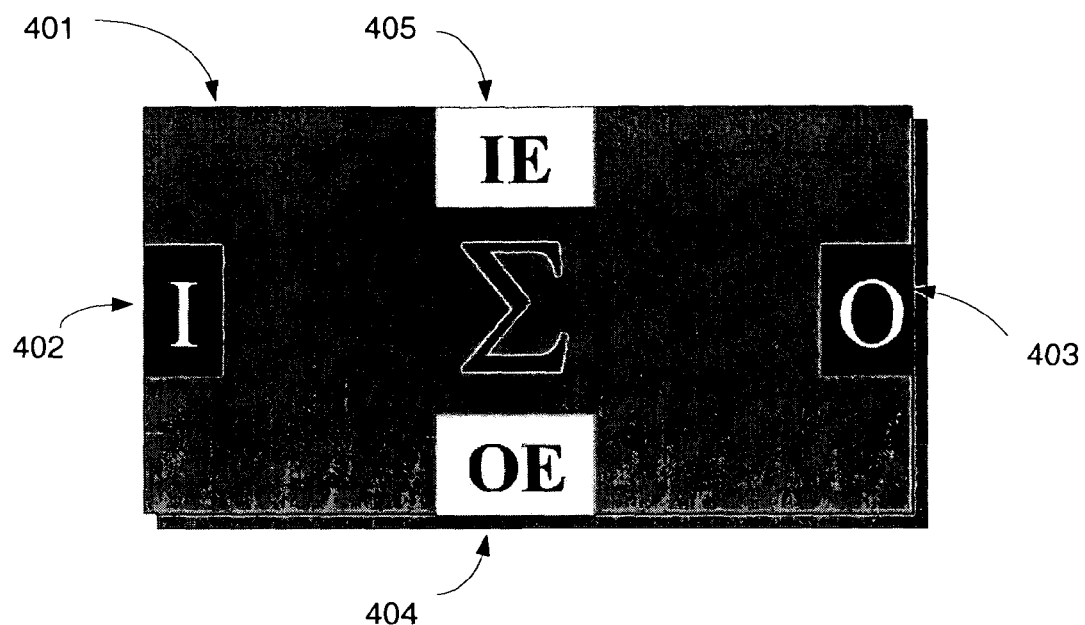
FIG. 4a illustrates an example of an icon for an algorithm according to some embodiments of the present invention.
Figure 4B:
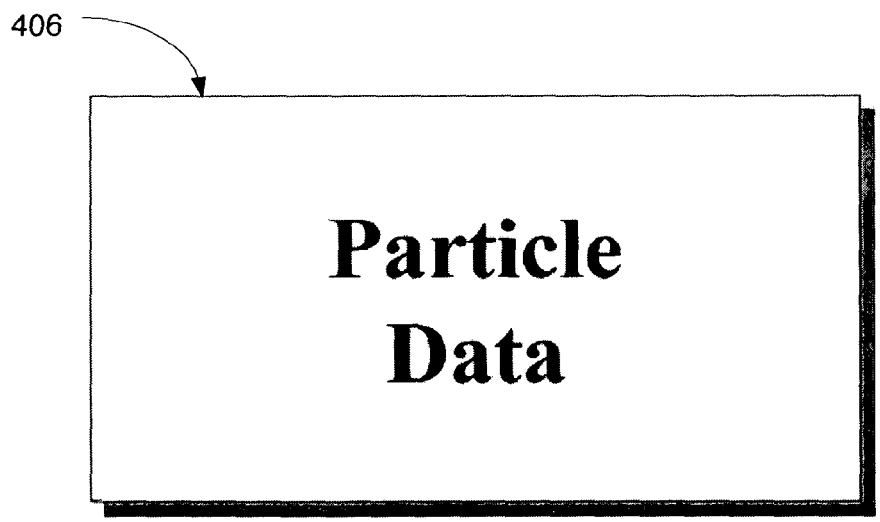
FIG. 4b illustrates an example of an icon that represents data according to some embodiments of the present invention.

FIGS. 4a and 4b illustrate example library element icons that may be used in various embodiments. FIG. 4a illustrates an example icon 401 for an algorithm, such as one that performs the following mathematical function:

$$\sum_{x}^{y} 2n+1$$

This example mathematical function receives three integers as input (x, y and n), and produces an output that is the sum of the function (2n+1) for all integer values of n ranging from x to y. As will be discussed further below, one unique feature of certain embodiments of the invention is that it has the intrinsic capability to perform floating point operations in conformance with ANSI/IEEE Std-754 (IEEE Standard for Binary Floating-Point Arithmetic).

Icon 401 may include one or more input data handles 402 to represent the input data that is to be provided to the algorithm. Using the above example, these inputs would be the values x, y and n. For algorithms that require more than one input, a single input data handle 402 may be used to represent all inputs. In alternate embodiments, there may be multiple data input handles, and each distinct input may have its own handle. Having separate handles increases the complexity of the icon, but allows for an easy way to see each distinct input to an algorithm.

Icon 401 may also include one or more output data handles 403. Similar to input data handles 402, output data handles 403 represent the output of the algorithm. Using the above example, the output would be a single integer value representing the sum of the function (2n+1) for all integer values of n ranging from x to y. An algorithm having multiple outputs may be represented by an icon having a single output data handle 403, or alternatively may be represented by an icon having multiple output data handles 403.

Since icon 401 may represent just one algorithm that is used with other algorithms in an overall desired process, there is often a need to coordinate the timing of when the algorithm will be performed, particularly when several of the algorithms may be asynchronous in nature. Using the above example, the output of the summation function may be needed by another algorithm, and as such, that other algorithm may need to know when the summation algorithm has completed its calculations. This sequencing of algorithms may be accomplished using event trigger signals, which are signals produced by algorithms to indicate their progress. An algorithm may receive one or more input event trigger signals, and may produce one or more output event trigger signals.

These event trigger signals may be represented in icon 401 as well. Icon 401 may include one or more output event handles 404, representing the various event trigger signals that may be produced by the algorithm. Icon 401 may also include one or more input event handles 405, representing the various event trigger signals that may be accepted by the algorithm.

Icon 401 shown in FIG. 4a is merely one example of how an algorithm may be visually represented. Variations may be used in other alternate embodiments, such as the addition or omission of one or more handles discussed above, variation in the shape (e.g., circular, square, trapezoidal, three-dimensional etc.) of the icon or handle, the placement of the handles (e.g., on edges, on corners, external to the rectangle, etc.), the presence or absence of labeling on the icons, etc.

The icon 401 shown in FIG. 4a represents an algorithm, or a kind of active process. Such algorithms and processes will often act upon some type of data, and as such, other types of icons may be used. FIG. 4b shows an example of an icon 406 that represents data. The data represented by the icon 406 may be any data, database and/or data structure stored in a memory or other circuit. Since data, by itself, does not perform any steps, it has no need for input, output, or event trigger signals, and does not need the corresponding handles described above. Connections to and from the data icon 406 may simply be made to the icon itself. The same may be done for algorithm icons 401 as well, although in such alternate embodiments, there would preferably be some manner of differentiating the input data, output data, input event trigger, and/or output event trigger signals for ease of use. Such differentiation may be accomplished by, for example, varying the line width and/or color of the various lines In addition to placing these icons in the Abstraction Window 305, a user will likely wish to identify how the various algorithms and/or data structures are interrelated for the particular desired process. The user may want to specify that the output of one algorithm is to be the input to another, or that a particular data structure is an input to yet another algorithm. The user may create these relationships by simply drawing a connection line between the various icons and their handles. A line drawn from the output data handle of one algorithm to the input data handle of a second algorithm indicates that the output of the first algorithm is the input of the second. The lines may be given different appearances based on the information they represent. For example, thick lines may be used to represent data, while thin lines may be used to represent event trigger signals. Other variations in format, such as dashed lines, line color, multiple lines, arrows, etc. may also be used to differentiate the lines.

For data structure icon 406, although no explicit handles are shown in that example, connections may still be drawn between the icon 406 and other input/output data handles to indicate when the data is the input/output of an algorithm. These connections may be referred to as data pipelines, where the input/output data may be referred to as data elements, and the input/output event triggers may be referred to as semaphores.

Figure 5:
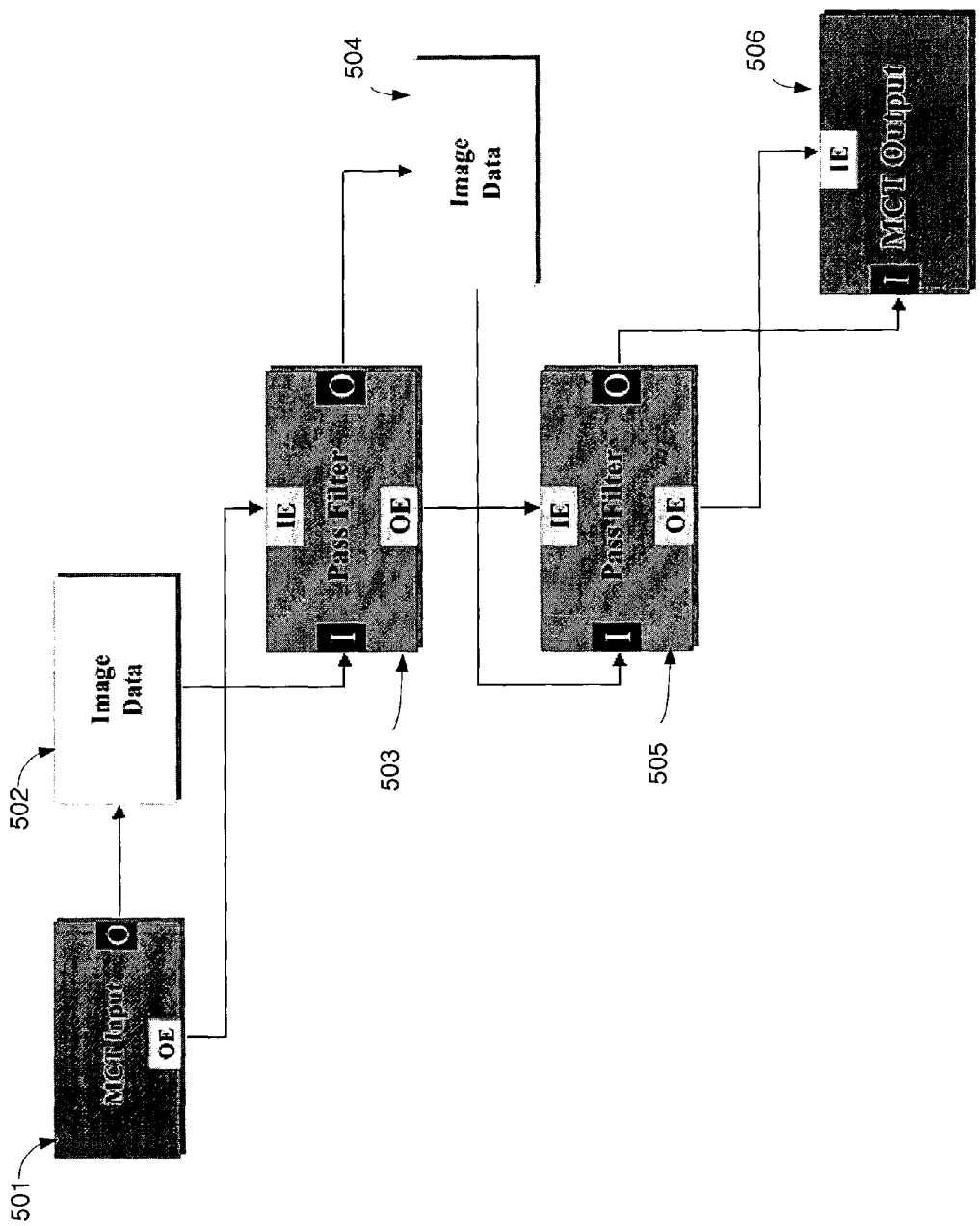
FIG. 5 illustrates an example of how icons may be assembled and interconnected to create a desired process in some embodiments of the present invention.

FIG. 5 illustrates an example of how these icons may be assembled and interconnected to create a desired process. In this example process, a circuit (a Multi-Channel Transport circuit) captures an image using a variety of light-sensitive devices and provides it to a first filter. The filter processes the image and produces a filtered image that is then supplied to a second filter. The second filter further processes the image, and provides the twice-filtered image to another circuit (another Multi-Channel Transport circuit) that finishes the process by displaying the filtered image on a monitor.

As shown in FIG. 5, the user has placed the first circuit, MCT Input 501, in the upper-left portion of the Abstraction Window 305. Since the MCT Input 501 circuit receives no external input, and receives no input event trigger, its icon does not show handles for these elements. In alternate embodiments, unused handles may nevertheless be displayed to serve as a reminder to the user of their availability, or to consolidate the types of icons that are displayed.

The MCT Input 501 icon has an output data handle that is connected to Image Data icon 502. The Image Data icon 502 is a data structure icon, and its connection to the output data handle of MCT Input 501 signifies that this data structure is the output of the MCT Input 501 circuit (e.g., the data representing the image that was captured by the MCT Input circuitry). This image data is also connected to the input data handle of the first Pass Filter algorithm 503, meaning that the Image Data 502 is provided as an input to the Pass Filter algorithm 503. Pass Filter algorithm 503 also has an input event trigger handle, which is shown connected to the output event handle of MCT Input 501. This connection may be used to ensure that the Pass Filter algorithm 503 does not begin its filtering until it receives the appropriate trigger signal from MCT Input 501 (e.g., when the MCT Input circuit 501 has captured a complete image).

Through this series of connections, the user can easily define the particular desired process. The first Pass Filter algorithm 503 may produce a filtered image that is output as Image Data 504, and may supply an output event trigger signal to a second Pass Filter algorithm 505. The second Pass Filter algorithm 505 may receive the filtered image from Image Data 504, and upon receipt of the appropriate input event trigger signal, may perform a second filtration on the image. The second Pass Filter algorithm 505 may output the twice-filtered image directly to another algorithm, MCT Output circuit 506, and may also supply it with an output event trigger signal as well. Upon receiving the appropriate trigger event signal, MCT Output circuit 506 may complete the process by displaying the twice-filtered image on a monitor.

When icons are placed in Abstraction Window 305, some embodiments of the present invention will permit users to access help information by right-clicking on the icon. Thus, for example, a user may click on the icon to quickly see the types of input data required for the algorithm represented by the icon, the types of output data produced, and whether any trigger events are produced or used by the algorithm. This help information may also provide contextual information explaining how the algorithm works and/or what the algorithm does. This help information simplifies the user's task of assembling the algorithms necessary for the desired process, and producing a logical graphical representation that can ultimately be converted to working computer code. Additionally, in some embodiments, a user may right-click on a portion of an icon, such as a handle, and obtain help specific to the particular portion or handle that was clicked. For example, a user might click on an icon's output event handle and see a message informing the user that the algorithm represented by the icon produces an output trigger signal, and may inform the user of the characteristics of this output signal (e.g., how many signals are produced, the type of signal, when they are produced, etc.).

Generating Computer Code

The example graphical user interface described above provides an easy way for a user to conceptualize and assemble a visual representation of a desired process. Once this visual representation is completed, however, the user may wish to have an executable computer program to carry out the process and/or format a reconfigurable computing platform to execute the process in hardware. The following description addresses various aspects that may be used for this process.

Figure 6:
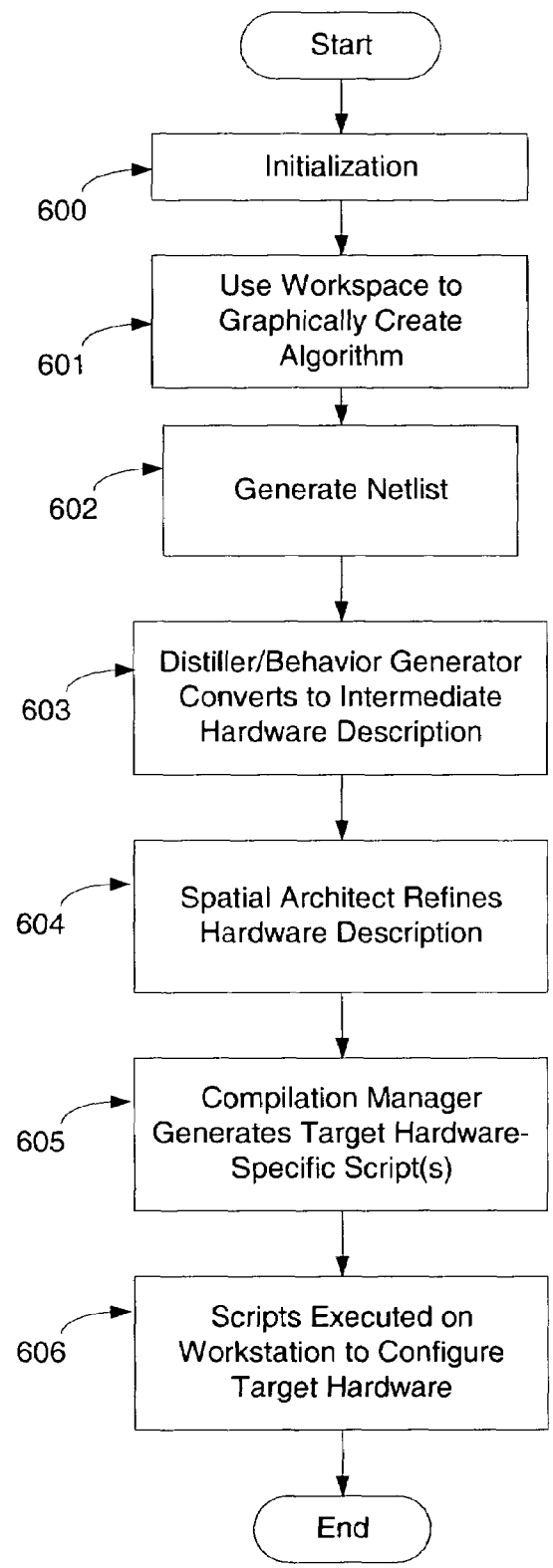
FIG. 6 depicts an example of a flow diagram showing steps involved in generating computer code corresponding to the user's desired process in some embodiments of the present invention.

To help illustrate an example process of preparing such computer code, FIG. 6 depicts an example flow diagram showing steps involved in generating computer code corresponding to the user's desired process. The example process begins with an initialization step 600. The step represents the preparation necessary to support the graphical assembly of code described above.

Several databases may be created during initialization and stored in a computer-readable medium, such as memory 106. One such database, referred to herein as the Code Database 109, may store individual segments of executable program code. Each segment may, when executed, carry out the performance of a predefined algorithm, such as the summation algorithm described above. The segments of code may be written in any computer language, such as C++, and there may be multiple segments for each algorithm. For example, the Code Database 109 may store multiple versions of the summation algorithm, to allow compatibility with a wider variety of software and hardware.

The individual code segments may require a number of input/output arguments and variables. To allow for interchangeability, the code segments may be stored in Code Database 110 with generic placeholder values for these arguments and variables. As will be explained below, these placeholders may be replaced with actual values as the code segments are assembled into a final program.

Another database that may be created is the Header Database 110. The Header Database 110 may specify the header format for each code segment stored in the Code Database. The header format may provide characteristic information regarding the algorithm, such as the number and types of input/output arguments. For example, the Header Database 109 may contain the following header for a C++ code segment implementing the summation algorithm described above, showing that the algorithm receives three integer values (n, x and y) and produces a single integer output:

pmc_int summation(int, int, int)

Header Database 110 provides a rapid way for the system to determine what input/output data is appropriate for each given algorithm, and may be used during the compilation process to ensure that the user properly identifies all necessary inputs/outputs. Although Header Database 110 is shown separate from Code Database 109, the header information need not be stored separately. In some embodiments, the header information may simply be stored with the code segments in the Code Database, and Header Database 110 might not even be created. This may save memory space, but may lead to slightly longer compilation times. The Header Database information may also be used by the contextual help facility.

Another initialization task that may occur is the association of the various algorithms with one or more graphical icons. These icons, such as summation icon 401, may be used to visually represent the icon in the workspace 300. In some embodiments, the icons include predefined images, such as the summation symbol ("$\Sigma$"), that may help the user easily identify the particular algorithm being represented. These various initialization tasks may be performed by a computer program, sometimes referred to herein as a "librarian," that manages the various databases and/or libraries available in the system.

Once the various code segments and databases are prepared, the process may then move to step 601, in which the user graphically assembles the various icons to create the desired process. The user may add icons representing the various algorithms, as well as interconnections showing the flow of input/output data and event trigger signals. As the user adds a connection between two icons in the Abstraction Window 305, the system may consult the database(s) to determine the types and numbers of input/output data required by each icon's respective algorithm, and may inform the user when the user attempts to provide incompatible data variables, such as connecting an icon's output of type "a" with another icon's input of type "b." This check may be performed by comparing the header information for the algorithms. In some situations, an algorithm's output will match precisely another algorithm's input (e.g., one algorithm outputs a single data element of type "a," and the user connects that output to an input of an algorithm that accepts a single input of type "a").

In other situations, there may be a difference in the number and/or types of output/input at either end of the connection. In such situations, the system may prompt the user to supply information regarding how the various arguments are to be distributed. Using the connection between the output data handle of Pass Filter 503 and the input data handle of Pass Filter 504, if Pass Filter 503 outputs three arguments of type "a," and Pass Filter 504 requires only two inputs of type "a," the user may be prompted to identify which of the Pass Filter 503 outputs are to be the Pass Filter 504 inputs. This identification information may be stored in the netlist. As another example, if Pass Filter 504 requires four inputs, the user may be prompted to identify which of the four inputs are provided by Pass Filter 503, and may be reminded that Pass Filter 504 requires a fourth input that has not yet been assigned. To assign this additional input, the user may simply create another connection between Pass Filter 504's input data handle and whatever source is to provide this additional input. Again, this argument information may be stored in netlist.

In some embodiments, the icons are displayed in the Abstraction Window 305 with a unique name to identify that particular instance of the algorithm. For example, the summation icon 401 may be displayed with the following legend: "summation_01." The user may choose the unique name, and the system may also automatically generate a custom name for the algorithm.

When the user has completed the process of creating the graphical representation of the desired process, the system may then move to step 602, in which the user's graphical representation is analyzed to generate a network description, or netlist, to be used in further processing. This analysis may be performed by a separate software process, referred to herein as the "analyzer." The netlist may contain information identifying the various icons that the user placed in Abstraction Window 305, an identification of the icons' corresponding algorithms and/or data structures, identification of the data and/or event trigger signal transfers that the user specified, and may also store positional data regarding the placement and arrangement of the various icons and lines.

In generating this netlist, the system (or the analyzer) may check to make sure that all of the required data arguments and/or variables are accounted for, and may prompt the user when an error or missing argument has been detected. In some embodiments, the netlist may be a high-level code database containing function prototype calls with blank (or placeholder) argument values for the necessary arguments. An example netlist used in some embodiments appears further below, in connection with the discussion of the thespian analogy.

In some embodiments, the netlist may be generated by a Netlist Builder routine that may be crafted as a compiled PROLOG program. This routine may access the libraries of information corresponding to the various icons in the graphical representation, and retrieve information to generate a netlist "node" data structure. The node data structure may include information necessary to affect an interface of the symbol into the matrix formed by the resulting netlist. This matrix definition may contain grouping, data flow and data type information that is needed for the downstream processing utilities, and may include a symbolic token ID, the number of input ports, the format of the input ports, the number of output ports, the format of the output ports, the time of execution (which may be in a predefined standard time unit, such as nanoseconds), and a pointer to a location of help information for the particular symbol. If the Netlist Builder cannot define an interface between two nodes due to mismatches in data types or parameter counts, the discrepancy may be flagged and presented to the user for resolution. Such resolution may include modification to the original algorithm design or the development of one or more new library entries.

Embodiments of the present invention may also include an Input/Output Definition File to provide information to the Netlist Builder concerning the input-output and memory requirements of the library entry. The file may be formatted as follows:

```
// ***** DeltaV__Adder.ios ****************************************
// * IO specification file for the DeltaV floating point adder entry   *
// * Copyright (c) 2003 Mentor Graphics Corporation                    *
// * All rights reserved.                                              *
// *****************************************************************
// Identity information
info_symbol         "DeltaV: :adder"        // library symbol string
info_id             "DeltaV: :1001"         // library index entry
info_version        "1.0.1"                 // version number
info_status         "RELEASED"              // release status
info_date           "28-Aug-2003"           // date of current status
info_author         "Mentor Graphics Corp." // library entry author
info_technology     "MGVS"                  // target technology name
// Library security information
security            PROTECTED               // write-delete status
encryption          NONE                    // source encryption
// Timing information
parameter_latency       27                  // execution latency
                                              27 nS
parameter_setup         2                   // minimum setup time
                                              2 nS
parameter_hold          2                   // minimum hold time
                                              2 nS
parameter_min_clock     20                  // mimimum clock period
                                              20 nS
// Inputs and Outputs
parameter_inputs        2                   // it has two input ports
parameter_outputs       1                   // it has one output port
parameter_in_width      32                  // it accepts 32-bit input
parameter_in_width      64                  // it accepts 64-bit input
parameter_out_width     32                  // it outputs 32-bit data
parameter_out_width     64                  // it outputs 64-bit data
parameter_io_format     IEEE754             // uses IEEE-754 float data
parameter_in_event      NONE                // it uses no event triggers
parameter out_event     NONE                // it generates no
                                              events
parameter_in_prop       NONE                // it uses no props.
parameter_out_prop      NONE                // it generates no props.
// Memory interface
memory_discrete         NONE                // no external discret mem.
memory_shared           NONE                // no external shared mem.
```

In some embodiments, the netlist generated by the Netlist Builder may be further optimized using another routine, called a Semantics and Structure Analyzer, which may also be crafted as a compiled PROLOG program. The Semantics and Structure Analyzer (hereafter, SSA) may accept as its input the netlist produced by the Netlist Builder (which may be just a "first pass," or initial, netlist). It may also accept a symbols library and a Semantics and Structure rules library (SSRL). The SSA is an artificial intelligence application that applies the rules found in the SSRL to the first pass netlist and determines the most efficient manner to restructure the netlist for hardware implementation. In particular, the SSA may determine which data paths in the netlist are serially dependent and which are not, and may adjust data type parameters of each netlist node such that information is properly passed among the nodes. The SSA can also ensure that the resulting netlist is compliant with the generally-accepted rules of mathematics.

In some embodiments, serially-dependent data paths may require that their related nodes be clustered together and structured in a pipelined manner for hardware efficiency and fidelity of the algorithm, and the SSA may repartition the netlist such that the serially-dependent sub-sets are isolated from those nodes with no serial dependencies. Non-serially dependent data paths may be instantiated as semi-autonomous hardware blocks that may operate in parallel with each other and with the serially dependent blocks. The ability to restructure the operational elements of the algorithm based upon data dependency ensures maximum possible performance by utilizing parallel hardware and pipelining to the greatest possible extent. The output may be a netlist with pipelined serial segments and parallel non-serial segments The output of the SSA is a spatially-architectured netlist that embodies the original user algorithm, and may be in a language-independent format. The optimizing feature of the SSA then reviews the resulting netlist to determine if there is any redundant hardware. Based on timing estimates derived from each library elements "execution time" entry (stated in standard time elements) identical hardware instantiations that spend most of their time "waiting" are shared by inserting data multiplexors into the netlist. The result of this optimization is blocks of hardware that are never exercised and are therefore deleted from the netlist.

When the netlist is ready, it may then be passed on to a Distiller/Behavior Generator (DBG) software program in step 603. The DBG analyzes the netlist and the various algorithms identified therein, and extracts the corresponding program code segments from Code Database 109. The DBG may substitute data variable values for placeholders in the code segments (or may leave placeholders as-is, depending on implementation), and then each of these segments may then be passed to a conversion utility that converts the code segments from their current format to a format more suitable for implementing the process in hardware. For example, the PRECISION C program, of Mentor Graphics Corporation, is able to convert computer code from the C programming language to a block of Register Transfer Level (RTL) code that implements the process in digital electronic elements. Other conversion utilities, such as Los Alamos National Laboratory's "Streams-C," Coloxica's "Handle-C," Y-Explorations' "exCite," and Synopsys's "Scenic," may also be used to perform some of the conversion process. At this stage, the code prepared by the DBG program may still include one or more placeholder variables that can be addressed by the Spatial Architect discussed further below. Further details regarding features found in the PRECISION C program may be found in U.S. Pat. No. 6,611,952, entitled "Interactive Memory Allocation in a Behavioral Synthesis Tool," and copending, commonly-assigned U.S. patent application Ser. No. 10/126,911, filed Apr. 19, 2002, entitled "Interactive Loop Configuration in a Behavior Synthesis Tool," and Ser. No. 10/126,913, filed Apr. 19, 2002, entitled "Graphical Loop Profile Analysis Tool," the disclosures of which are hereby incorporated by reference.

The DBG may require configuration information to identify the target hardware in order to select and use the appropriate code segments. For example, the user may need to inform the DBG of the type of reconfigurable hardware, the number of units it contains, the type of memory it needs, etc., so that the DBG knows what kind of hardware will be running the process, and can extract the correct type of code segment for use. The output of the DBG may be individual code segments in a hardware format, such as RTL. RTL is a superset of both VHDL and Verilog hardware description languages. It is readily synthesized into formats (using any number of commercially-available compilers) suitable for hardware instantation.

In some embodiments, the Code Database 109 may store code segments in RTL format, in which case the DBG might not be needed for the conversion. For example, technology libraries may be written for use with the Precision-C user's library. Additionally, emulator primitives may be provided by the manufacturer of the particular target hardware, and those primitives may also be stored within Code Database 109.

In alternative embodiments, the DBG may output the code segments in a high-level format, such as the C++ programming language. The high-level format may then be compiled and executed on a general-purpose computer (as opposed to reconfigurable hardware), allowing the particular process to be tested even before it is converted and downloaded into the reconfigurable hardware, potentially saving time if an error is detected. For example, the code may be output in an ANSI C format. The ANSI C output format may be used with "pure" C compilers, when the purpose is to produce a C program that will run on a conventional computational platform. This program may be used, for example, for debugging the algorithm. Alternatively, the code may be output as Structural Verilog. Targeting structural Verilog may simplify the use of the algorithm in high-end logic emulation systems and in the translation into ASIC (Application Specific Integrated Circuit) form.

As part of the DBG's operations, an Output Formatter routine may be written in tcl/Tk to accept the optimized netlist from the SSA and the users output language selection, and build a table of information for each node in the netlist. From this tabular information it may extract the output code from one of the product libraries. Each library entry may contain a sub-section of code for each target language. In some embodiments, the root language for developing library entries is "pure C," which is the dialect of the C programming language that is fully supported by both C and C++ compilers.

Then, in step 604, the various blocks of RTL code may be passed to another program, referred to as the Spatial Architect utility. The Spatial Architect takes the blocks of RTL code, as well as the netlist data (which identifies the various data input/output assignments for each algorithm), and determines the best way to assemble the code fragments into a monolithic block of code representing the user's desired process. In doing so, the Spatial Architect accesses the netlist to obtain the necessary data/event trigger transfers, and may stitch the individual code fragments' port sections together such that the necessary input/output data transfers are implemented.

The Spatial Architect may also make modifications to add security parameters, such as the introduction of encryption, password features, serial numbers, etc. into the code, and can also add code for handling input/output (IO) capabilities. For example, the Spatial Architect may note, from the netlist, that a particular process is to receive an input from a satellite data receiver. The Spatial Architect may access a library of predefined code (such as from Code Database 109) and retrieve code segments, such as software drivers or "Transactors," that interact with the satellite data receiver and produce a predefined type of output. The Spatial Architect may automatically insert this code as the source of input to the algorithm. If the output from the satellite data receiver code is not of the proper type (e.g., an integer output when a floating point input is needed), the Spatial Architect may include predefined code for converting data types, and may apply some of this predefined code to match the input/output.

The Spatial Architect may also make certain decisions concerning the manner in which the various algorithms will be implemented in hardware. As one example, the Spatial Architect can examine the netlist to determine whether a particular data structure should be instantiated as a single- or multi-ported memory. Referring again to the process shown in FIG. 5, Image Data 502 represents data that is accessed by two distinct algorithms: MCT Input 501 and Pass Filter 503. When this data element is instantiated in hardware, it may be instantiated as a multi-port memory, with a separate port for each separate algorithm that will need access to the memory. In alternative embodiments, some or all of this analysis may be performed by the DBG.

If Image Data 502 and 504 are both of the same type, the Spatial Architect may decide to instantiate both memories as a single circuit. In this way, circuit components may be conserved, but a slower operating speed may result, as both processes will be sharing the same circuit for storage of their images. As an alternative, the Spatial Architect may instantiate the memories as two distinct circuits. Doing so allows for a faster operation, since the two algorithms can now be pipelined for streamlined operation. Pipelining refers generally to situations where two algorithms may be sequential within a single process (such as the two Pass Filters in the FIG. 5 example), but where both algorithms may operate simultaneously as data is "piped" through the abstraction. For example, while the second Pass Filter 505 is processing the Image Data 504 produced by the first Pass Filter 503, that first Pass Filter 503 may move on and begin processing the next Image Data 502. In this streamlined manner, sequential algorithms may operate simultaneously, increasing the throughput of the overall process. The decision between size and speed may be a configuration option chosen by the user.

Figure 7:
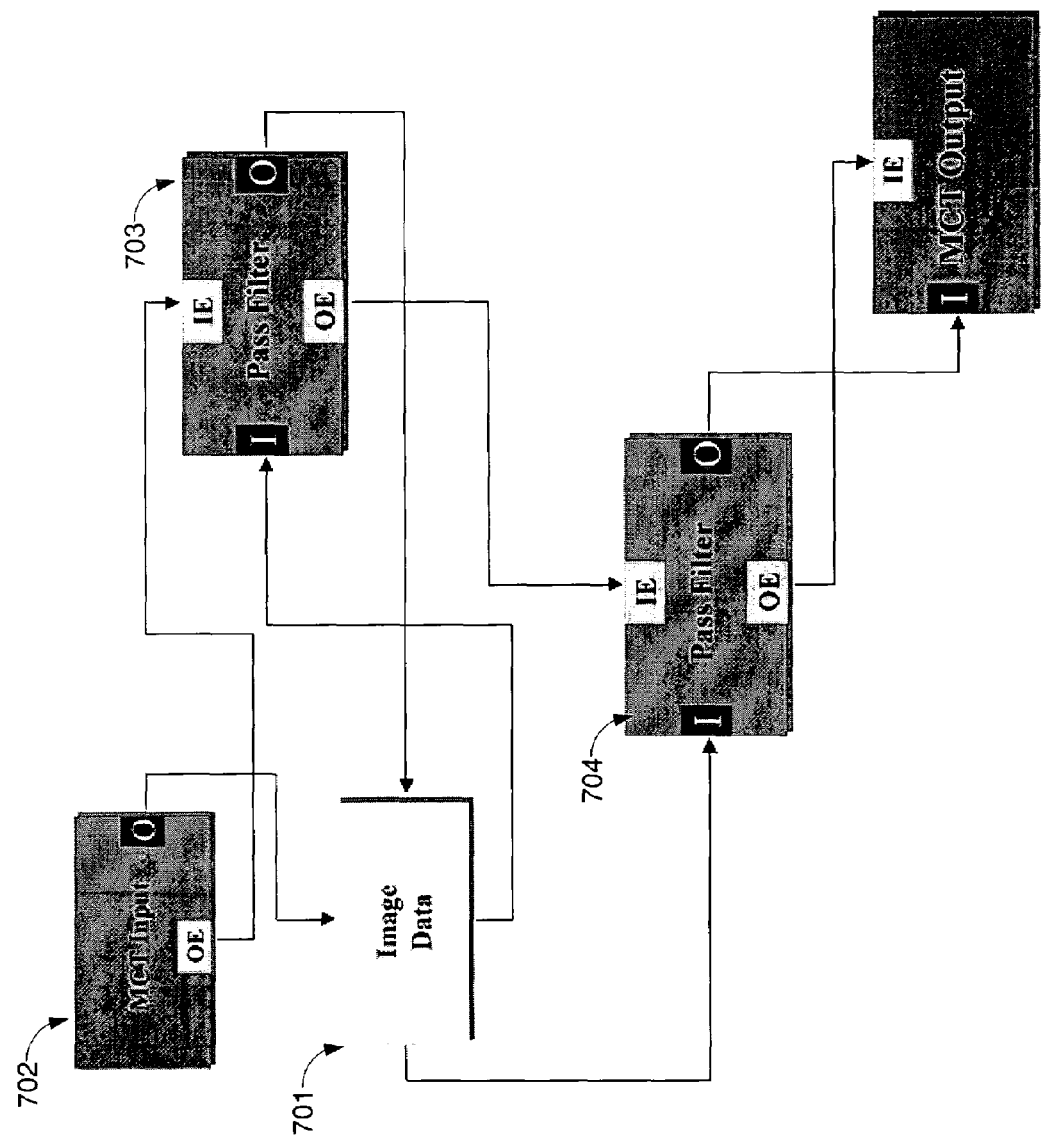
FIG. 7 illustrates an example of a process having a data dependency.

To determine whether particular algorithms are capable of being pipelined, the Spatial Architect may examine the process to determine whether any data dependencies exist between the algorithms. In general, a data dependency exists when two or more algorithms require access to the same data element. FIG. 7 illustrates an example process having a data dependency. Image Data 701 is written to by both MCT Input 702 and Pass Filter 703, and as such, those two algorithms are data dependent on one another and cannot be pipelined for simultaneous operation. If desired by the user, the Spatial Architect may assemble the RTL code in a manner that instantiates non-data-dependent algorithms in parallel hardware. This assembly may be performed based on the directions provided in the netlist.

In some embodiments, the Spatial Architect (or other system software, such as the librarian) may store this block of code in Code Database 109, and may create an icon associated with it such that the user's desired process may be used as an icon in the future. This flexibility allows the user to create an adaptive, up-to-date library of algorithms.

When the Spatial Architect has prepared the block of RTL code representing the user's desired process, this block of RTL code may then be passed on, in step 605, to a hardware compilation manager that can compile RTL code into a format suitable for downloading into the target emulation system. For some emulation systems, this downloadable format is a binary file that sets forth the "routing tables" for the various memory elements 102 of the reconfigurable hardware 101. One such compiler is the VIRTUAL WIRES series of compilers offered by Mentor Graphics Corporation. One piece of information needed for this process is the identity of the reconfigurable hardware 101 that is to be used (since different manufacturers may have different ways of configuring their hardware). The user may be prompted for this additional information at any stage in the process.

The compilation manager may also generate one or more scripts that may be used to download the compiled code into a reconfigurable platform 101. In this manner, the scripts and binary files may be generated at one location, and distributed to the locations of the reconfigurable hardware for execution and loading. This may avoid the necessity of having additional development stations at each reconfigurable hardware location. Then, in step 606, the various scripts may be executed on a workstation (such as workstation 104) to configure the reconfigurable hardware 101.

Several advantages may be realized by this process. For example, the binary files that are used by typical reconfigurable computing platforms 101 are near impossible to reverse engineer. This is due to the fact that the binary code is essentially the "truth table" contents of the various elements 102 in the reconfigurable platform and include not only the algorithm, but all of the routing and timing data for signal multiplexing as well; by its nature an unintelligible string of ones and zeros. Anyone intercepting these download files would need to know at least the specific hardware configuration of the target reconfigurable platform, all the compiler switches and have access to the original library elements to even begin to decipher the string of ones and zeros. Accordingly, these binary files offer a secure way to transmit signals intelligence analysis (SIA) information. A plurality of target hardware stations may be placed around the world, and whenever a user modifies a process to generate a new download file and process, the user can use insecure channels to transmit that download file to the worldwide hardware stations, and have reasonable confidence that the transmitted algorithm is still secure. To further increase security, some embodiments of the present invention may still encrypt the download files, and may also use authentication such as RSA Corporation's SecurID protocol.

The discussion above gives illustrative examples of several embodiments of inventions disclosed herein. However, those of ordinary skill will readily see that many variations may be made. For example, in an alternate embodiment, workspace 300 may be displayed on a display 107 having a screen that can detect the presence of a pointing device, such as a stylus. The user may use a stylus to handwrite symbols in Abstraction Window 305. In such an embodiment, the system may employ handwriting recognition software to detect when a user has drawn a predefined symbol, such as one of the icons 303. Upon detection of such a symbol, the system may automatically consult the various libraries to assemble the computer code necessary for implementing an algorithm represented by the icon. In this manner, the user need not drag-and-drop the predefined icons 303 into Abstraction Window 305, but instead can simply draw them by hand—much like the way an instructor may write on a chalkboard. In such alternative embodiments, Icon Window 302 need not even be displayed, or may be displayed simply as an assist to the user who is writing in the Abstraction Window 305. The necessary computer code can be dynamically assembled as the user is writing in the Abstraction Window 305, allowing for the rapid preparation of computer code to implement the author's algorithm—without requiring the author to be proficient in computer programming. Furthermore, as a user writes out the various symbols, the system may automatically output high-level (e.g., C, C++, ADA, etc.) code representing the symbol's algorithm and/or the entire process thus far, and/or may output lower-level code versions of the same, such as VHDL or RTL. As a user edits and/or deletes from the image being drawn, the system may even automatically erase the code segments that it had prepared in response to the user's creation of the symbol. The computer system can thus serve as a natural, and near invisible, assistant to the author such that the author need not even know how to program a computer or reconfigurable platform.

A variety of input formats may be used, in addition to (or instead of) the ones described above. For example, inputs may be provided in three types. The first, referred to herein as Type-1, format may be the netlist described above. It may be a language-neutral intermediate format that treats each node as a call to the various algorithm libraries. Type 1 format nodes may be referenced in an existing library, such as one of the following, to support their use:

Theater Library
Stage Library
Actor Library
Prop Library
Directions Library
Core Math Library
Optional Application Libraries
User Defined Theater Library
User Defined Stage Library
User Defined Actor Library
User Defined Prop Library
User Defined Directions Library
User Defined Core Math Library
User Defined Optional Application Libraries A second type, Type 2, may be a vector, bitmap or other visual graphics format, including JPEG, GIF or BMP formatted documents. Type-2 formatted input can come from any type of graphics (drawing) program, web page image captures, etc. In some embodiments, an interactive digital whiteboard may be used to generate such images. This commercially-available device (e.g., the Panasonic KX-BP800) provides a large drawing surface in the form of a whiteboard. The image drawn on the whiteboard is then converted into a bitmap or vector image and transferred, upon command, to the host computer via an RS-232 serial interface. Alternatively, a digitizing tablet may be used. The digitizing tablet is typically interfaced to a graphics program and the output is then saved in either a bitmap (.bmp) or vector (.jpg, .tif, .gif) image format (also Type 2 formats).

The Type 2 formats may produce visual images that need to be converted to a logical form (e.g., Type 1) for further processing. Conventional Optical Character Recognition (OCR) software (such as those offered by ScanSoft Corporation) may be used to scan these images and convert the image into a series of image tokens, where each token represents a single character from the image. The user may then review the captured image on the computer screen and makes any necessary corrections or adjustments, and then accept the corrected tokenized image.

The tokenized image may then be passed to an Equation Parser (EP) where it is analyzed syntactically and structurally and parsed into token groups that represent the parenthesized equation(s). At this point superscripts and subscripts may also be structured into the new image. The re-tokenized image may be presented to the user for concurrence or adjustment (as may be needed).

The Netlist Builder (NB) may consult a symbols database (discussed below) that compares the tokens in each token group with its contents to determine if a hardware instantiation for each token (or token group) exists. Where no hardware instantiation exists the user is prompted to create one as described above. Once all tokens or token groups have associated library elements the NB may output its "first pass" netlist of the algorithm.

The third type, Type 3, may be a plain ASCII text file in which equation elements are specified using normal keyboard characters and macro definitions. By using the internal reference names for the symbols in the symbols library, the user may elect to manually enter an equation using only a simple ASCII text editor. The practice is analogous to manually entering equations using Mathmatica or MatLab. This may be useful if the user is working with a device that cannot run a graphics program capable of producing a Type-2 format output (e.g., using a PDA or handheld organizer).

The Macro Expander (hereafter, ME) may be a utility crafted in tcl/Tk that accepts the output of the EP, ASCII text file or graphical authoring utility described above and expands the equation macros into a Type-1 data file.

As a further feature, the system may be expandable. The system software, which may be the librarian discussed above, may update its libraries of algorithms and processes as the user creates them. In some embodiments, when a user has decided that a particular process is worth saving, the librarian may automatically store the code segment(s) that it assembled for the process, and may add it to the library of available algorithms. In this manner, the user may access dynamic, up-to-date libraries of the various processes and algorithms she has created.

To facilitate expandability, some embodiments may use a "mainframe" and "snap-in" modular approach to the software code. The mainframe may allow simultaneous revisions to the various processes described above, and may provide a consistent foundation for adding features and functionality embodied in modular "snap-in" code. For example, in some embodiments, a core mainframe program may include a Tool Command Language (TCL) and/or Tool Kit (TK) scripting engine to allow for internal scripting. Some snap-ins may be written in TCL/TK scripting form, as opposed to, for example, the higher-level C++ language. The mainframe may also include code for generating the workspace 300 described above, and its related features. The mainframe may also include code for managing the various libraries of algorithms and processes, and may include some basic libraries such as basic math functions, architecture functions, and/or input/output functions for transfer of data between a target hardware and its host (workstation). The DBG and Spatial Architect described above may also be incorporated in the software mainframe, as well as a compilation manager, which may be a TCL/TK snap-in that generates script files for performing various compilation steps associated with the creation of binary download files for the target hardware. The compilation manager may also supervise execution of the scripts on the target hardware's host workstation or other compilation station. The mainframe may also include a snap-in coordinator to manage the various snap-ins and coordinate their activities, and may also serve as an interface to the license manager(s) (if any) required by software used in the system.

In some embodiments, a data collection algorithm may be defined to represent an "unknown" algorithm whose process is under study. For example, in studying an unknown physical phenomenon (example discussed below), the user may wish to create a process having a large number of known behaviors or algorithms, and these algorithms may provide their outputs to the "unknown" data collection algorithm. The "unknown" data collection algorithm may simply include a process for collecting and/or recording the data it receives, such as by placing it in a predefined data structure. The "unknown" algorithm may also include logic to react to certain predefined conditions, such as sending an alert signal when a received input exceeds a predefined amount. The data collected by the "unknown" algorithm may subsequently be analyzed to discern patterns that may help the user define the behavior under study. For example, a researcher may be interested to know how a variation in temperature may affect a particular physical mass as a whole. The user may already know how individual portions of the mass react. Using an unknown data collection element, the user can define a process to simulate variations in temperature, and cause sample temperature data to be collected by the unknown data collection element. The data collected by this element can then be studied to discern a behavioral pattern to the mass' thermal characteristics.

In some embodiments, the user may be given a greater degree of control over the amount of serialization of the various nodes in the netlist. The Spatial Architect (SA) may provide a tool that allows the user to adjust the architecture of the algorithm, as it will be instantiated in hardware. To accomplish this, the SA may work on the netlist after it has been processed by the Semantics and Structure Analyzer (SSA). For example, the SA may scan the netlist and identify the various serially-dependent nodes, and display them onscreen in a graphical manner that depicts their dependencies. For example, the workspace 300 may be used to display the nodes on the computer screen in a manner where the Y-axis (vertical axis) represents time and the X-axis (horizontal axis) represents parallel displacement. The SA may display data flow by connecting the nodes with lines of varying weight and color, with the line weight indicating the relative width of the data transfers in bits, and the line color indicating data dependencies; none, serial, pipelined, etc. Other visual representations may be used as well. Using a pointing device, the user may move the icons representing the netlist nodes around within the workspace 300. Orientation of the non-serially dependent nodes in time allows for optimization in later steps. When the user is satisfied with the spatial and time orientation of the nodes, the may be called again to scan the netlist for hardware elements that, because of their time displacement, may be shared. The data flow of the netlist may then be modified by including multiplexors in the logic, and a new version of the netlist may be produced. In some embodiments, the user may, capacity permitting, elect to split the input data set and prepare multiple instantiations of the algorithm. The SA includes a "replicate" option that will create multiple copies of the netlist in parallel in the hardware, separating them by isolating their IO facilities.

Further embodiments may also include a graphical Memory Map utility (hereinafter, "MMU"). The MMU may display the finished netlist on the screen, and the user may then determine which nodes should use autonomous local memory and which should use shared memory. For any node, the user may request to see the node's embedded memories on the computer screen by, for example, "control-left-clicking" on the node. The user may select a specific memory and determine if it should be instantiated as a local, protected memory, or a shared global memory. Memory use may be graphically identified in a variety of formats, such as by color and border style. In some embodiments, the user may simply draw a rectangle around the various nodes that are to be in a shared memory or local memory. When the user attaches a global memory resource to a node it causes the NB to generate (synthesize) a multi-ported memory. For each node connected to the memory, a unique port is generated to that memory. Arbitration on shared memories may be determined by node ID number. When multiple nodes desire to access the memory at the same time the node with the lower ID number may be given priority. After all nodes have had their access to the memory (on that bus cycle) the process repeats the next time multiple nodes conflict. Local memories require no arbitration.

As a further alternative, a Library Builder (hereinafter, "LB") program may be written, for example, in C++ to carry out various library management functions, and may serve as a database manager. For example, the following types of libraries may be used: Theater, Actor and Prop libraries defined by the user; direction libraries defined by the user or supplied by an Original Equipment Manufacturer (OEM). Application libraries may also be used, such as OEM core math libraries and other application libraries, or user-generated libraries. Referring to the Theater Abstraction concept presented above, the Direction, Prop, Actor and Theater libraries may be collections of completed algorithms that have been saved as discrete entities for later use. The LB may store these library entries in a tree structured database.

The application libraries may be somewhat different. Since they are the core building blocks for actors, props, directions, theaters, etc., they may be written in "pure C" and then translated using commercially-available translation utilities into RTL. The RTL may then be translated into structural Verilog using a commercially-available synthesis tool. The new library entry may thus end up with three forms: C, RTL and Verilog, each of which may be maintained in the database(s) described above. Since each library entry may be entirely autonomous, there is no need to manage memory or memory sharing outside the library entry, thus simplifying its maintenance and instantiation.

The Library Builder may manage the libraries above as a tree structure. For example, the library master index may be at the top of this structure, and there may be a number of branches to the tree. Three possible primary branches of the tree are protected, secure and open. The "protected" library entries may be read by any user but can only be written to by the library creator (Mentor Graphics). The contents of the "protected" library are those entries that are directly supported by the library creator. The "secure" libraries are those that are created by the user but for reasons of security have restricted read access. The "open" libraries allow both read and write access to all authorized users.

Figure 8:
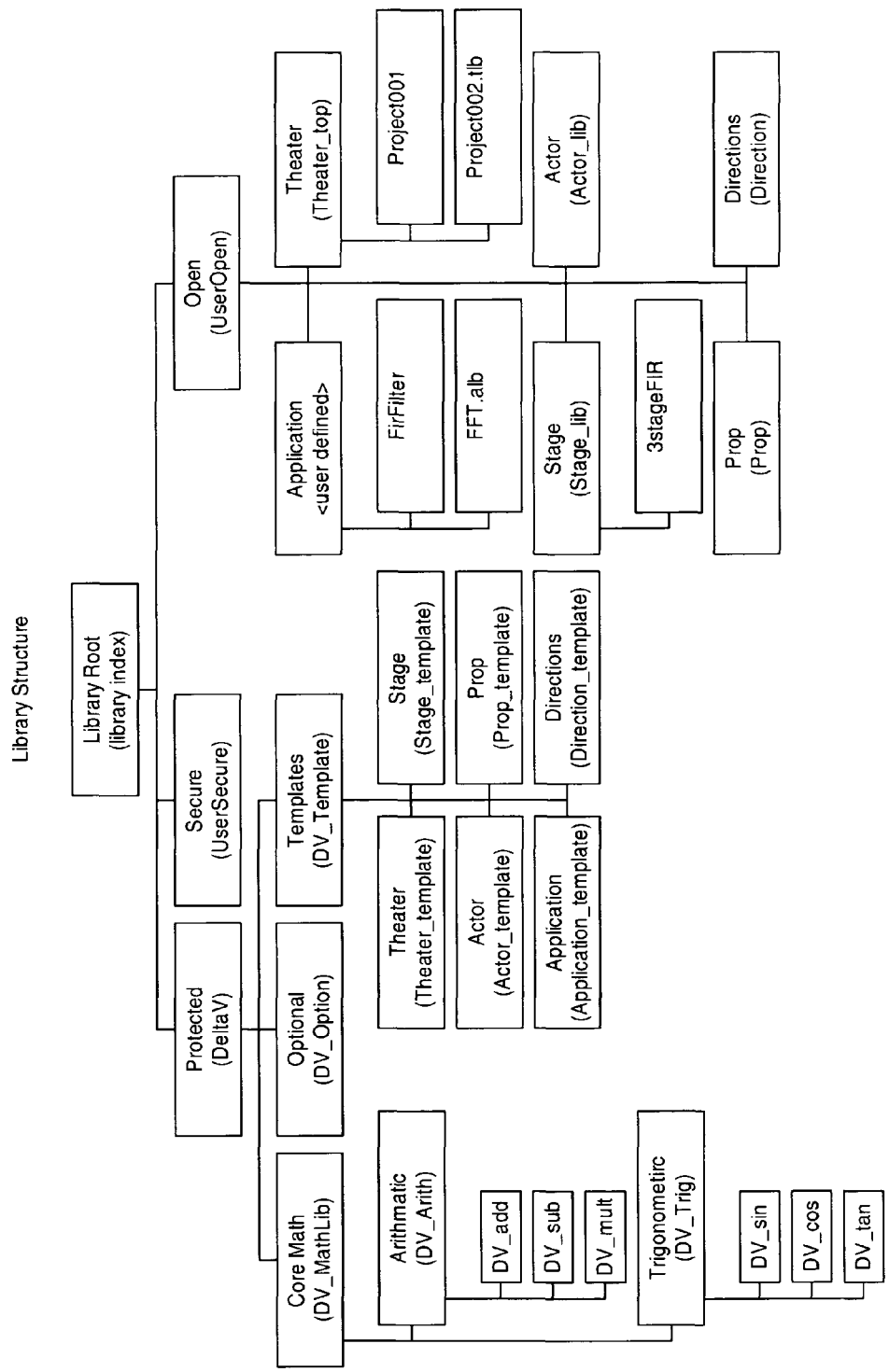
FIG. 8 shows a hierarchy diagram illustrating how the user's desired process may be abstracted and analogized to a theater production in some embodiments.

FIG. 8 illustrates an example hierarchy of a library structure. In actual use, some embodiments could include thousands of entries. Each library entry may consist of multiple files, each of which has a distinct function. In order to keep the library organized, each entry (symbol) has a unique director (as noted in the FIG. 8 diagram). The individual library entry structure (including superior directories leading to it) may be as indicated below (the reference to "theater" will be described below):

```
Library_Root (directory)
    Protected (directory)
        Core_Math (directory)
            Arithmetic (directory)
                Adder (top directory)
                    Adder.ios (io-specification file)
                    Adder.ico (icon file)
                    Adder.sym (symbol file)
                    Adder.hlp (help file)
                    Adder_C ("c"directory)
                        Adder.c (source file)
                        Adder.h (header file)
                    Adder_CPP ("c++" directory)
                        Adder.cpp (source file)
                        Adder.hpp (header file)
                    Adder_RTL ("RTL" directory)
                        Adder.rtl (source file)
                    Adder_V ("Verilog" directory)
                        Adder.v (source file)
```

A number of databases may also be stored and used to support the various features described above. For example, a Symbol Library may be a graphics library that contains all the symbols recognizable by the OCR engine for handling Type 2 data. The OCR engine compares the entries in the symbols library with the symbol under conversion to determine its identity. Maintenance of the symbol library may be handled by the OCR engine embedded in the product. A Rules Database may be a non-structured, non-indexed collection of PROLOG rules that effect the operation of the Equation Parser contained within a single ASCII text file. It may be maintained with any ASCII text editor. A Macro Database may be a b-tree organized, indexed random access database driven by the Microsoft "JET" database engine, or alternatively, any OLDB compliant database engine using SQL constructs and semantics. This database contains the methods of expanding the equation macros (single symbols or their text representation) into core math elements found in the main libraries. It is initially populated by the OEM and then maintained by the user. A Netlist Symbols Database is a b-tree organized, indexed random access database driven by the Microsoft "JET" database engine, or alternatively, any OLDB compliant database engine using SQL constructs and semantics. This database contains the methods of expanding internal primitive types in the Type-1 data into target language objects. This database may be initially populated by the OEM and then maintained by the user with the system software, such as the librarian. Some or all of the database and/or librarian functions described above may use database engines, such as the Microsoft JET engine, for management.

Figure 9A:
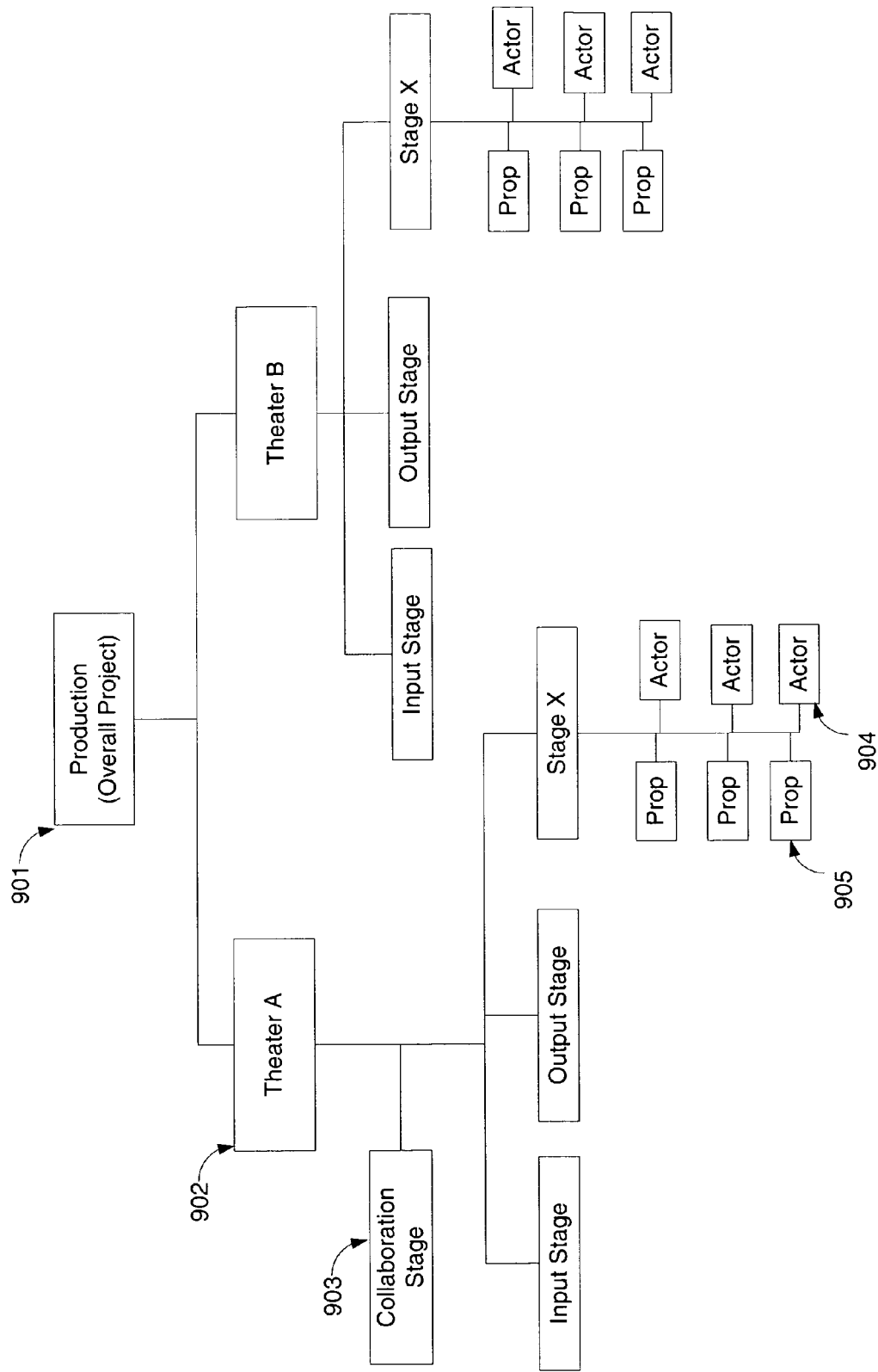
FIG. 9 illustrates a block diagram example of how the FIG. 8 abstractions may be implemented in the final hardware.

A user's desired process essentially seeks to accomplish, or act out, some behavior. To help users who may be unfamiliar with computer programming concepts, the development process may be analogized, in some embodiments, to a thespian stage production, where the "play" (e.g., "Romeo and Juliet") represents the process to be "acted out." FIG. 9a shows a hierarchy diagram illustrating how the user's desired process may be abstracted and analogized to a theater production. The overall project may be referred to as a production 901. A production may be created using a computer workstation 104 and/or mainframe by the end user, and may organize libraries and source files that are used by the overall process. Within a production may be a number of Theaters 902, and within each theater may be a number of stages 903. In some embodiments, a first theater (Theater A) may represent a local site, such as the system on which the development is to take place, while other theaters (e.g., Theater B) may be either remote or local.

The various theaters and stages on Broadway are different locations in which events may be acted out, and in keeping with that analogy, the distinct theaters and stages in the FIG. 9a production may represent distinct areas in which events may take place. In some embodiments, each stage may have its own visual representation and Abstraction Window 305, and their resulting circuitry may each be instantiated as distinct circuits. Data connections may exist among theaters and stages to allow them to exchange control and/or data signals. Collaboration Stages may effect the virtual interconnection of the various theaters, allowing them to communicate with one another through a consistent mechanism. Users in different locations may share the Collaboration Stage to work together on a particular process. In some embodiments, separate stages may be created for Input and Output. These stages may represent the physical mechanism by which the system, or theater, receives or supplies information. For example, the FIG. 5 process may be an Input Stage for the capture and initial processing of image data. If a particular production employs multiple theaters and/or stages in a single piece of hardware, the various theaters and stages may share the use of a single Input Stage and Output Stage.

On any given stage, there may be a number of actors 904. Actors 904 represent the algorithms that carry out some predefined functionality. These algorithms may be control-enabled or autonomous. Control-enabled algorithms await the receipt of one or more event trigger signals prior to execution, while autonomous algorithms may continuously execute (or execute whenever necessary data is received). The data and other elements used by the Actors are represented as props 905.

The prop, actor, stage and theater levels of abstractions are just that—abstractions. They provide a logical approach to arranging and managing the various algorithms in the user's process. These abstractions may be implemented in code prior to their hardware instantiation, and the following sections include some example software code (in C++) for these abstractions. The software architecture of a prop may be data element defined as follows:

```
pmc_Prop propname(
    pmc_PropFlag = "bit vector string"; //register may be used for
                                          error and semaphore
                                          traffic
    <data type> elementName1;
    <data type> elementName2;
);
```

The software architecture for an actor may be defined as follows:

```
pmc_Actor actorName (
    pmc_InputHandle inputHandleName = {
        <input_type> inputHandleName1;
        <input_type> inputHandleName2;
    };
    pmc_OutputHandle outputHandleName = {
        <output_type> outputHandleName1;
        <output_type> outputHandleName2;
    };
    pmc_PropList stagePropNameList = {
        prop-01-01;
        prop-01-02;
        prop-01-03;
    };
    pmc_Event Processor stageEventProcessor;
);
```

The software architecture of a stage may be defined as follows:

```
pmc_Stage stageName (
    pmc_InputHandle inputHandleName = {
        <input_type> inputHandleName1;
        <input_type> inputHandleName2;
    };
    pmc_OutputHandle outputHandleName = {
        <output_type> outputHandleName1;
        <output_type> outputHandleName2;
    };
    pmc_PropList stagePropNameList = {
        prop-01-01;
        prop-01-02;
        prop-01-03;
    };
    pmc_ActorList stageActorListName = {
        actor-01-01;
        actor-01-02;
        actor-01-03;
    };
    pmc_Event Processor stageEventProcessor;
);
```

The software architecture of a theater maybe defined as follows:

```
pmc_Theater theaterName (
    pmc_InputStage inputStageName;
    pmc_OutputStage outputStageName;
    pmc_CollaborationStage collaborationStageName;
    pmc_PropList theaterPropNameList = {
        prop-01-01;
        prop-01-02;
        prop-01-03;
    };
    pmc_StageList theaterStageListName = {
        stage-01-01;
        stage-01-02;
        stage-01-03;
    };
    pmc_EventProcessor theaterEventProcessor;
);
```

A netlist generated by the analyzer may appear as follows in some embodiments:

```
// Sample output of the analyzer.
start theater
actor_embodiment "001"                                              //naming an actor "001"
    //interface
    use    actor_library    "DeltaV_core_math"     //importing an existing library
    use    prop_library     "DeltaV_core_props"
    in_handle               a, b                   //create input handles named a and b
    out_handle              ret_val                // create output handle named ret_val
    event_handle            input_available, output_ready
                                                   //create event handle for two predefined
                                                   //events
    timing async                                   //indicates that the timing is
                                                   //asynchronous, with no external timing
                                                   //dependencies
    target_dependency       NONE                   //indicates that the actor is not target-
                                                   //specific, and will work on a variety of
                                                   //platforms
    security                NONE                   //indicates that no encryption is used
    help                    "DeltaV_core_math_multiply"
                                                   //defines where to get the help file for
                                                   //this actor
    // abstractions
    cast                                           //identifes the other predefined actors
                                                   //included in this theater
        actor   "parse_float"                      //includes an actor of the type
                                                   //"parse_float" in the theater
        actor   "32-bit_multiply"
        actor   "make_float"
        event   "input_available"                  //defines the two events that are needed
        event   "output_ready"
    props
        data    "pmc_float"            a, b, ret_val
                                                   //defines three props of the type
                                                   //"pmc_float", named a, b and ret_val.
                                                   //Using the predefined handle names a, b
                                                   //and ret_val creates connections - two
                                                   //inputs and an output-to actor 001
        data    "pmc_word"             ahi, alo, bhi, blo
                                                   //defines a prop of data type "pmc_word"
                                                   //not yet used
        data    "pmc_dword"            term_1, term_2, term_3, term_4
        data    "pmc_fStruct"          in_s_a, in_s_b, out_s
    // process
    direction                                      //defines how the actors and props
                                                   //interact
        pipeline    on input_available    accept a, b
                                                   //pipeline indicates that this step in the
                                                   //direction can occur continuously, each
                                                   //time the input_available event trigger is
                                                   //asserted. As an alternative to pipeline,
                                                   //"static" may be used to indicate an
                                                   //action that occurs once. "accept a,b"
                                                   //means that the data handles a and b
                                                   //accept their input.
        pipeline    on a & b               parse_float a, b to in_s_a, in_s_b
                                                   //when a and b are both ready, use the
                                                   //parse_float function on a and b, with
                                                   //output sent to in_s_a and in_s_b
        pipeline    on in_s_a & in_s_b    do    32-bit_multiply to out_s
                                                   //when in_s_a and in_s_b are ready, do a
```

```
                                                    //32-bit multiply of those values, and
                                                    //provide output to out_s
        pipeline   on out_s                 do    make_float out_s to ret_val
        pipeline   on ret_val               trigger output_ready
end "001"
// Subsequent instantiations
actor_embodiment "002"
      replicate   "001"                     //make duplicate actor of 001, named
                                            //002
end "002"
actor_embodiment "003"
      replicate   "001"                     //make duplicate actor of 001, named
                                            //003
end "003"
// Structure - tells spatial architect how to assemble the actors and props
stage_embodiment "top_001"
      place     "001" & "002" & "003"       //puts 001, 002 and 003 into this stage
      link      "MCT_port_1_1" to "001_a"   //provide data from MCT_port_1_t to
                                            //input "a" of actor 001
      link      "MCT_port_1_2" to "001_b"
                                            //provide data from MCT_port_1_2 to
                                            //input b of actor 001
      link      "MCT_port_2_1" to "002_a"
      link      "MCT_port_2_2" to "002_b"
      link      "001" to "003_a"            //links output of 001 to input "a" of 003
      link      "002" to "003_b"            //links output of 002 to input "b" of 003
      link      "003" to "MCT_port_3_1"     //links output of 003 to port
                                            //MCT_port_3_1
end "top_001"
end theater
``` abstract "theater" to actor in library "user_actor_library" as "Y_multiplier"

Figure 9B:
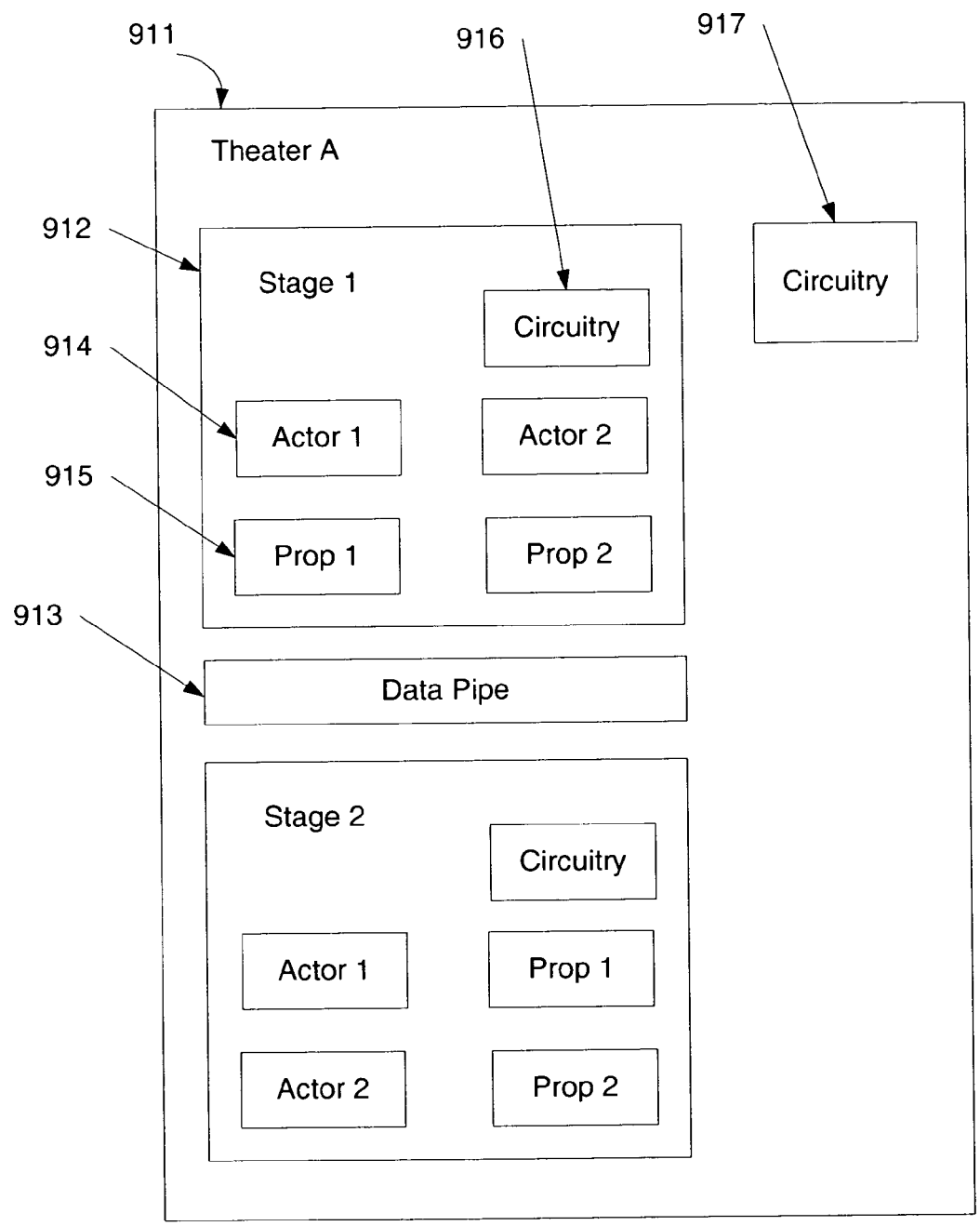

FIG. 9b illustrates a block diagram example of how these abstractions may be implemented in the final hardware. A single theater 911 may contain circuitry located at a first location, such as the location of the development platform on which the user created the desired process. The hardware for the theater 911 may include a number of stages 912 (a hardware subset described below), and a data pipe circuit 913 that may be accessed by various elements in the theater to transfer data. Each stage 912 may include a number of actors 914 (e.g., circuits that carry out an algorithm) and props 915 (e.g., circuits that store predefined data structures), as well as common circuitry 916 that may be shared by the various elements of the stage to help carry out handshaking of the various asynchronous processes in the system.

The Data Pipe 913 may include circuitry for carrying out the exchange of data between the various circuits of the system. In some embodiments, this Data Pipe 913 may be instantiated as a 37- or 69-bit wide port for the uni- or bi-directional transportation of information, the specific configuration of which may be established by the user. A number of memory registers may be used to temporarily hold this data while it is awaiting collection by a destination circuit, and the circuitry may also include address and timing control logic to coordinate this transfer of data. Multiple instances of Data Pipe 913 may also be used to increase transmission capacity.

The common circuitry 916 may include an input port for receiving a clock signal from the target hardware's main clock to synchronize the transfer of data. When a circuit needs to output data, it may place this data in static registers on the Data Pipe 913, and the destination circuit may read the data from the Data Pipe 913 when the clock signal enables the read. This may be helpful for deskewing and synchronizing data transfers. Since the local clock may be hardware dependent, this clock input port may be instantiated when the overall RTL code is generated. The common circuitry may include circuitry for receiving an Input Ready signal from each circuit that is ready to accept input data, and an Output Available signal from each circuit that has placed output data on the Data Pipe 913, and may manage the timing of the transfer of data from these outputs to the inputs. The common circuitry may also include circuitry for sending and receiving a Data Mode signal that can allow a data recipient to understand the data that is on the Data Pipe 913. The Data Modes may be statically defined at compile time.

A stage's common circuit 916 may include circuitry for receiving a START signal, which may cause the particular process carried out in the stage to begin execution. A stage's common circuit 916 may also include circuitry for receiving a HALT signal, which may cause every circuit in the stage to immediately halt processing. This may be carried out by gating the local clock signal, and processing may resume where it left off when the HALT signal is deasserted. A stage's common circuit 916 may also include circuitry for receiving an ABORT signal, which causes the circuits in the stage to terminate processing and/or return to a default state.

Similar to the common circuit 916 associated with each stage 912, each theater 911 may also include its own common circuit 917 that is shared by the various stages 912. The components of the theater's common circuit 917 may contain some or all of the same components found in the stage common circuit 916, but may affect a larger scale of abstraction. For example, the Input/Ouput signals may indicate that the particular theater is ready to receive/transmit data to a circuit outside of the theater 911, such as another theater in a different location.

By using the common circuitry 916/917, the various algorithms and/or processes that become instantiated may operate on hardware platforms that are geographically dispersed. The common circuitry may include circuitry for using telephone, radio-frequency, Internet, and other forms of communication between physically-separate devices to allow the sharing of data and collaboration of effort. Processes may be executed in parallel not only within a given hardware platform, but across multiple platforms.

This abstraction may be used to create simple-to-understand menu commands for Workspace 300. For example, the Workspace 300 Menu Bar 301 may contain a variety of menu options that apply this theater analogy for the user. In the FIG. 3 example, the Menu Bar 301 may contain the following general options: FILE, CREATE, EDIT, VIEW, ARRANGE, CODE, BUILD, RUN, TOOLS, and HELP. The FILE menu option may contain options for opening, saving, closing, replicating, or deleting an existing theater, prop, actor, etc., and may also allow the user to simply exit the program.

The CREATE and EDIT menu options may allow the user to create or edit the various theaters, stages, actor, or props in the user's process. The user may also be given options for creating a new library of code segments, and may also create a new set of help messages for use with an existing or new library.

The VIEW menu option may contain options concerning the arrangement of Workspace 300, such as the windows to be shown, the toolbar elements to include. The menu may also include options for displaying the user's production as an overall abstraction (e.g., displaying a chart similar to FIG. 8 illustrating the various processes), displaying a listing of the currently-enabled hardware details, and even displaying a graphic representation of the data flow within the process. The View menu option may permit the user to place various icons and interconnections on the workspace, and can be used to select a view of the production, theater, stage, actor and/or prop.

The ARRANGE menu may contain options that allow the user to rearrange the theater and/or stage, and may include commands for altering the topography of the current view (such as replicating, deleting, moving, editing icons, etc.), which may affect how the spatial architect will render it in hardware. The menu may also include the option for how the code is to be optimized (e.g., should the Spatial Architect favor serialization over parallelization, or vice versa, or whether the system should be optimized for speed or size).

The CODE menu option may include options for generating computer code that carries out the user's desired process. The menu may include options for generating code in a selected language (such as C, RTL, Verilog Netlist, etc.). This option may be useful when a particular process needs to be provided to a variety of systems with differing hardware.

The BUILD menu option may include a variety of options relating to generation of the binary download files from the computer code. This may include options for building the files for the actual target hardware, and may also include options for building the files to be used by other software programs that emulate reconfigurable hardware platforms, such as System-C or ModelSim. This menu may also include configuration options, such as setting the target hardware details, compilation details, and/or translation details for the compilation and/or software.

The RUN menu option may contain a number of options for executing the user's desired process. This may be done, for example, by using a number of software simulators (e.g., System-C, ModelSim, etc.). This menu may also include the option of causing the target emulation hardware to begin execution of the desired process.

Event Processing

As discussed above, many algorithms (such as control-enabled actors) may use event trigger signals to control the timing of their execution. In some embodiments, a single generic data type may be defined for these event trigger signals. By using a common data type, generic circuitry may be used to handle the event trigger signals. In some embodiments, each algorithm that is interested in an event signal may include an Event Processor to handle the event signals. Alternatively, the Event Processor circuitry may be instantiated for each abstraction, such as an actor or stage. The Event Processor may be supplied with information, such as the netlist or a simple lookup table, that identifies the various input/output event trigger signals for each algorithm. The generic event trigger data type handled by this Event Processor may include the following types of event trigger signals:

EVENT_ACTIVITY_COMPLETE—is a signal that an algorithm (actor, stage or theater level of abstraction) may assert when it has completed its execution. Upon receipt of this signal, the Event Processor may determine which other algorithms are "interested" in this completion (e.g., which algorithms receive this as an input trigger, also known as "interested parties"), and may transmit a signal to those algorithms indicating that the completion has occurred.

EVENT_ACTIVITY_WARNING—is a signal that an algorithm may assert to indicate that it has failed to complete its execution, but that the error was not a fatal one, and that it largely completed its execution. When an algorithm asserts this event trigger signal, it may also transfer a "semaphore" containing warning data describing its progress and/or the error to the interested parties.

EVENT_ACTIVITY_ERROR—is a signal that an algorithm may assert to indicate that it has failed to finish execution due to a fatal error. The algorithm may also transmit a semaphore containing data describing the error to the interested parties.

EVENT_ENTITY_READY—is a signal that an algorithm may assert to indicate that the algorithm is ready to receive new or additional input, such as raw data or a data type.

EVENT_PROP_ARRIVAL—is a signal to indicate that a completed prop or data structure has been received by a particular theater or stage (or a data structure associated with a theater or stage). The Event Processor may use this signal in determining whether to send an activation signal to interested parties. The signal may be generated by a reduced version of the data pipe, referred to as a prop transporter, which may be a shared memory utility. The reduced version is possible if the prop is referenced using a relatively small pointer.

EVENT_PROP_DISPATCH—is a signal that may be generated when a prop or data structure is transmitted to a different location, such as a different stage or theater. The Event Processor may transmit a signal to interested parties indicating that the prop is on its way.

EVENT_PROP_CHANGE—is a signal that may be generated when an algorithm modifies an existing prop. Upon receipt of this signal, the Event Processor may consult a netlist or lookup table to determine which other algorithms need to be notified of the change in the prop, and may send such notification to those interested parties.

EVENT_PROP_INITIALIZATION—is a signal that may be generated when an algorithm creates a new prop. Upon receipt of this signal, the Event Processor may consult a table or listing to determine which other algorithms need to be notified of the creation of the prop, and may send such notification to those interested parties. The initialization of a data structure essentially reserves memory space in software, and sets the data to a predefined initialization value. When implemented in hardware, the circuitry for the new data structure may have been previously allocated to the prop, and initialization may simply refer to setting the memory contents to the predefined initialization value.

EVENT_PROP_DESTRUCTION—is a signal that may be generated when an algorithm destroys an existing prop. Upon receipt of this signal, the Event Processor may consult a table or listing to determine which other algorithms need to be notified of the destruction of the prop, and may send such notification to those interested parties. The concept of "destroying" a data structure essentially clears memory in software, but when the program is implemented in hardware, the circuitry previously used to store the data structure need not physically be destroyed. Instead, that circuitry might simply be cleared to a predefined neutral value (which may or may not be its initialization value).

USER_DEFINED_X—are event trigger signals that the user may define. These user-defined events may be transmitted using an 8-bit dedicated port used by each Event Processor. In some embodiments, the most significant bit may define the direction of the signal, and the remaining seven bits may simply be used to identify the user-defined event trigger signal being sent.

The common circuitry within each stage or theater may also include a Semaphore Processor, which may be circuitry used to handle the transportation of the various semaphore control data described above. Like the Event Processor, the Semaphore Processor receives the various event semaphore data sent above, consults a lookup table (or netlist) to identify the recipient algorithm, and forwards the semaphore data to the recipient. The Semaphore Processor may handle event transfers, but may also transfer other types of data, and may be user-definable. To support this transmission, each stage or theater may instantiate a separate communication port (or circuitry) for the various other Semaphore Processors with which it will communicate. At their heart, semaphores may be viewed as data structures that may contain any reasonable data type consistent with the physical method of transport within the target hardware. They may be similar to props, although instead of carrying data to be manipulated, they carry control data. The transport mechanism for semaphores may simply be wires interconnecting the input/output registers of the Semaphore Processors of the various stages and/or theaters.

To support the transfer of event trigger signals, the system may instantiate a separate port, also referred to as an Event Pipe, for each event trigger connection that an algorithm has. The Event Pipe circuitry may facilitate the transfer and buffering of event trigger signal data. In some embodiments, the Event Pipe is instantiated to carry out one-way communication, and might not be as simple as a wire bus. Using such unidirectional communication circuits helps minimize the risk of erroneous event trigger signal transfer. However, it is also possible to instantiate an Event Pipe as a bi-directional circuit, which may be helpful in situations where two algorithms each send event trigger signals to each other.

Since various embodiments of the present invention may be used for mathematical algorithms, some embodiments offer native support for one of the more troublesome aspects of computer math—floating point calculations. In existing computing systems, a processor's arithmetic logic unit typically includes a predefined data structure for handling floating point values (if they are handled at all). This predefined data structure may allow a certain number of bits for the exponent and mantissa. The predefined size requires that floating point calculations first conform the data values to the predefined size, which may require execution time to do. Additionally, the conversion to the predefined size may even be irrelevant to the particular calculation in question. For example, if the processor requires a 13-bit exponent, but the particular calculation in question will never need more than 4 bits for the exponent, the time spent to conform the data value to the processor's requirement will be wasted time.

Some embodiments of the present invention overcome this deficiency by providing support for arbitrary floating point values. In such embodiments, the system may define a separate hardware circuit for each algorithm that needs one, and may define a custom-sized floating point data architecture for use in the calculation.

Thus, for example, embodiments may support 32- and/or 64-bit floating point data architectures. Under a 37-bit data pipe architecture, a floating point value may be represented using a 1-bit sign, 8-bit exponent (bias of decimal 127), and 23-bit mantissa/significand. The remaining bits may be a 1-bit data clock port, a 1-bit Ready for Input flag, a 1-bit Output Available port, and a 2-bit mode select port (to allow input/output/bi-directional). Using a 69-bit data pipe, the same Data Clock port, Ready for Input port, Output Available port and Mode Select ports may be used, and the sign bit may again be a single bit, but the exponent may be expanded to 11-bits (a bias of decimal 1023), and mantissa/significand may be 52-bits.

Each instantiated element or circuit, whether it be actor, stage, or theater level of abstraction, may instantiated with a circuit that uses the 37- or 69-bit data pipe. An example argument may be as follows (in the C++ language):

pmc_io37[input, output]

or pmc_io69 input[input, output]

The single bit vector (or data pipe) may then be overloaded with smaller individual registers such that individual components (e.g., sign, exponent and mantissa) of the bit vector may be immediately transacted into target registers. The process may then declare the target registers "on top" of the input/output data pipe, and may have the following arguments to define where, in the data pipe, the various floating point values begin, as well as other data that may be needed, such as a clock and ready signal:

pmc_bit clk=*(pmc_bitPointer*) input [msb];

pmc_bit rdy=*(pmc_bitPointer*) input[msb-1];

pmc_byte exp=*(pmc_bytePointer*) input[msb-6, msb-13]

pmc_bit.sign=*(pmc_bitPointer*) input[msb-14]

pmc_fMan.man=*(pmc_bytePointer*) input[msb-16, msb-24]

The following data structure may then be defined and used to accurately reflect a floating point value:

```
typedef struct pmc_fStruct {
    pmc_bit      sign;      // defines a sign bit
```

-continued

```
    pmc_byte    exp;        // defines an exponent byte
    pmc_fMan    mantissa    // defines the mantissa as type fMan
}
static const pmc_fMan fpDivisor = 0x800000;  // defines a static variable used to
                                             // convert binary to decimal
static pmc_fStruct workData;  // instantiates an example variable workData of
                              // type pmc_fStruct
workData.sign    =    inputSign;
workData.exp     =    inputExp - 0x7F;        // remove the bias
workData.man     =    inputMan | 0x800000     // the value is OR-ed to obtain
                                              // just the mantissa bit
```

Using this data structure (or one like it), any value may be represented as a fraction consisting of an integer dividend and integer divisor. The product is then multiplied by the constant 2 raised to the exponent power:

Value=workData.sign((workData.man/fpDivisor)*2exp (workData.exp))

Consequently, the original value becomes a fixed-point number (fp) greater than or equal to zero, but less than 2. Using such an approach can be accomplished in hardware since the fixed-point number is efficiently manipulated and addition/subtraction/shifting of exponents efficiently determines the radix point for computational results.

Fractional-format notation can readily represent this floating point value, eliminating the need for a fixed-point divider circuit. Thus, using a 32-bit float as example, the value may be static const pmc_fixed<26, 4>RECFPDIV=2.0exp(−23);
Value=workData.sign(workData.man*RECFPDIV*2exp (workData.exp))

This definition may be instantiated in hardware using a pipelined pair of shifters, since both RECFPDIV and the value 2exp(workData.exp) are powers of two.

The above example assumes that the system is using ANSI 754 float type. This Fractional-format notation works equally well for ANSI 754 doubles and for the non-standard extended (80-bit) double.

Arbitrary range and precision floating point storage that do not use the ANSI-754 standard may use the following specialized types:

typedef pmc_arb_float<WL, EXP><name>

Such that WL represents the total word length including sign bit, and EXP represents the exponent (which must be an even number) and the bias for the exponent will always be considered to be one half of the maximum exponent. [ALWAYS] The mantissa or significand will simply be (WL-EXP-1) and the ANSI 754 method of using an "implied" or "hidden" initial bit in the mantissa (for normalized numbers, per the standard) may be used as well. As the circuits are instantiated, computer code referencing this newly defined data type will result in circuitry that has been modified to handle the architecture described above. In this manner, floating point values may efficiently be handled.

By permitting such arbitrary width of the floating point data value, some embodiments of the present system provide a more efficient way to handle floating point calculations. Defining the data structures in this way may also automatically modify the algorithm for implementation, as the system (e.g., the DBG or Spatial Architect) may discern the size of the value directly from the data structure, and may automatically modify the algorithm to, for example, include a predetermined amount of shifting operations to match the data sizes of two floating point values that are being summed.

EXAMPLE APPLICATIONS

Embodiments of the present invention may be used in any field where a user may wish to have a hardware implementation of a software process. Given the inherent speed advantages of running software using dedicated hardware, it is easy to see that the applications to which the present invention may be put to use are near limitless. The following discussion addresses examples of fields where one or more embodiments of the present invention may be advantageously used.

Example

Modeling of Physical Phenomena

The first field deals with the use of a reconfigurable platform to create modeling of physical phenomena. Research in the areas of physical phenomena (e.g. Chemistry, Physics, Cosmology, Meteorology, Geology, etc.) is largely dependent upon and frequently restricted by the availability of sufficiently powerful computational platforms. This difficulty is compounded by the inappropriateness of generally available computer programming languages (e.g. C, C++, Fortran, ADA, Basic, etc.) when applied to the solution of parallel dependency problems. Research efforts would be significantly expedited and their accuracy improved if the researcher had a computational engine that was specifically designed to solve the specific issue facing the researcher and an applications development environment that makes the reconfigurable platform easy to use.

An additional problem is that conventional languages are generally procedural in nature and designed for use by computer programming experts. The majority of physical sciences researchers view the computer as a "necessary evil," a cumbersome tool that does not conform to the thought process of scientific study nor conforms well to the actual real-world behavior of the physical phenomenon to be studied. The vast majority of physical phenomenon manifest themselves not a step-by-step changes, but rather as complex interactions with many simultaneous (parallel) events. This complex real-world scenario is not always effectively modeled using conventional practices. Because of these problems the resultant programs and their performance frequently prove slow, unreliable and nondeterministic.

Figure 10:
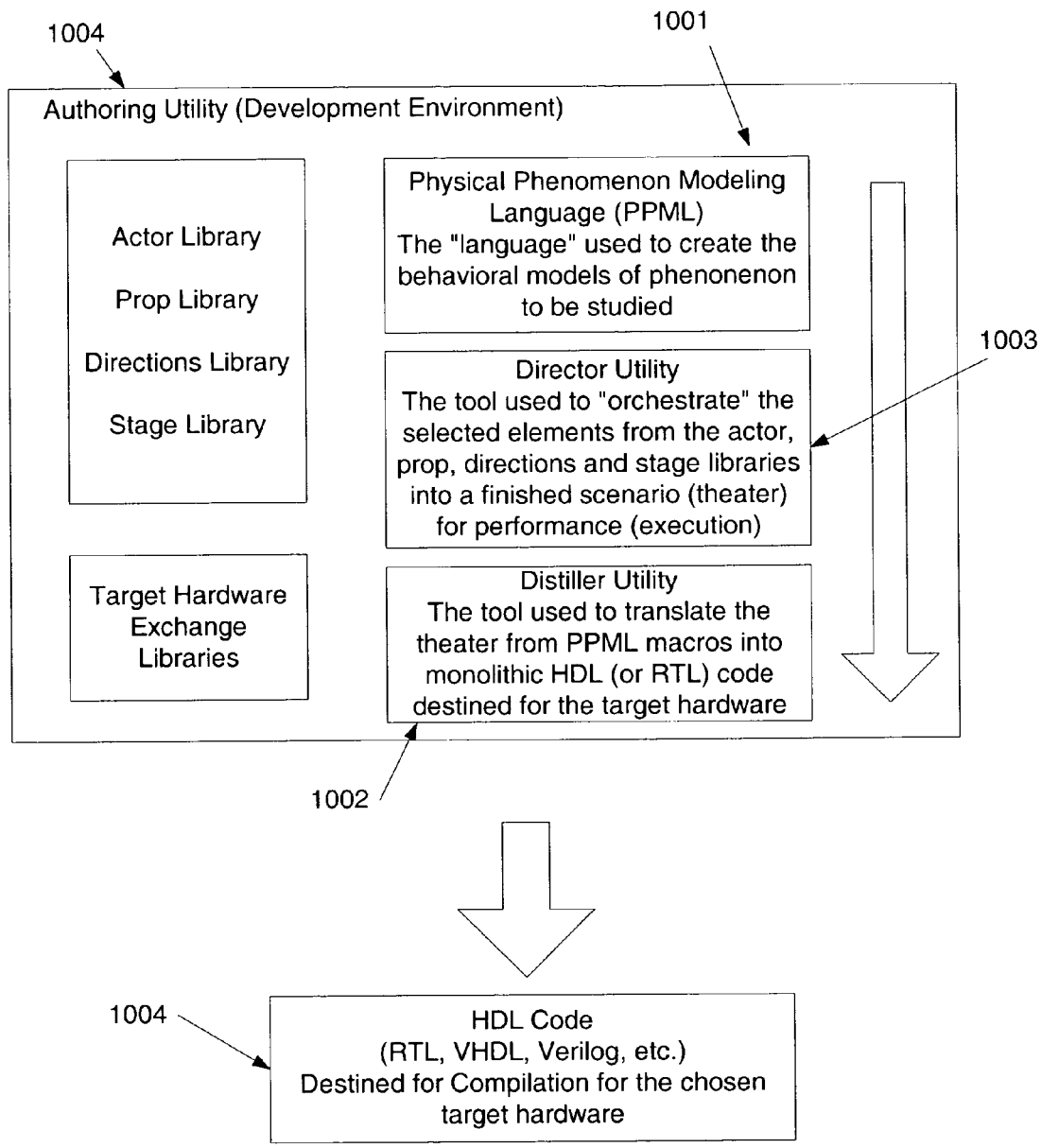
FIG. 10 shows a block diagram process flow used in some embodiments of the present invention, and represents a process that is similar to that shown in FIG. 6 above.

Embodiments of the present invention may include a structured methodology and a rules-based applications development environment (as discussed above) that addresses and can be used to solve the problems defined in the above paragraphs. FIG. 10 shows a block diagram process flow used in some embodiments of the present invention, and represents a process that is similar to that shown in FIG. 6 above. Aspects of the invention represent a unique application of commercially available reconfigurable platforms such as Mentor Graphics Corporation's V-Station family of emulation systems and existing reconfigurable logic systems technology, such as described in U.S. Pat. Nos. 5,596,742; 5,854,752; 6,009,531; 6,061,511; and 6,223,148, the disclosures of which are incorporated herein by reference. U.S. Pat. Nos. 5,036,473 and 5,109,353 also describe technology to which aspects of the present invention may be applied, and are also incorporated by reference. Embodiments of the present invention may also be adapted for use with other logic emulation systems such as those manufactured by AXIS Systems, Inc., and Cadence Design Systems, Inc. as well.

By using a commercially available, very large scale, reconfigurable computational platform, combined with aspects of the present invention, the researcher does not need to actually design and build an application specific compute engine. Additionally, the researcher does not have to attempt to adapt a sequentially threaded, procedurally based programming language for use in solving event triggered, behaviorally-organized phenomena.

The massively parallel nature of the reconfigurable platform allows the problem to be partitioned into manageable elements with fast and reliable communications pathways allowing them to be solved by the hardware. Since the hardware (target platform) is actually configured to solve the specific problem and operates in a truly parallel manner, the time to calculate the solution is dramatically accelerated; depending upon the level of interactivity between elements, by as much as 1000 times over the same calculations performed on a conventional computational platform.

As shown in FIG. 10, some embodiments of the present invention contain four key components. First, there may be a Physical Phenomenon Modeling Language (PPML) 1001. The PPML may be a loosely structured application development language specifically engineered for the modeling of physical phenomenon. PPML is unique in that it need not be a procedurally organized language; but rather may be structured behaviorally allowing the creation of both independent and interactive "actors" which respond to event triggers thereby emulating the real-world behavior of the phenomenon being studied. The PPML 1001 may take the form of the various code segments stored in Code Database 109 and their associated icons.

Second, there may be a PPML to HDL Distiller 1002. The Distiller 1002 may accept the PPML definitions of the individual "actors," "stages," and "theaters," and may distill them into HDL descriptions for carrying out a user's defined process. The "distiller" may be configured to support whatever HDL is used by the target emulation platform, e.g. RTL, VHDL or Verilog. These PPML definitions may be a netlist generated in step 602 above, and may perform the DBG step 603 described above.

Third, there may be a Director Utility 1003. The Director Utility is a tool that may accept the PPML constructs for "props" and "cues," and synthesize them into HDL statements that form the data pathways and event triggers that interconnect the "actors" and "stages" into a cohesive "theater" in which the phenomenon is studied. The director's output may be piped into the distiller utility for incorporation with the other theater elements. The Director Utility may perform tasks as discussed above with respect to the spatial architect, and may be a process running in the background while the user creates the graphical representation of the process. As the user connects the various actors and props graphically the director utility (running in the background) generates the netlist commands that define the control architecture of the theater.

Fourth, there may be an Authoring Utility 1004. The "authoring utility" may be a graphical user interface to the PPML, Distiller and Director. It allows the model's author to construct actors, props, stages, scripts and directions at any reasonable level of abstraction by defining fundamental behaviors for each of these elements. Once defined, the elements (actors, props, stages, etc.) may be collected into libraries and/or logically interconnected into the final theater form. Operating at its highest levels of abstraction, the authoring utility allows drag-and-drop authoring of even extremely complex phenomenon. The authoring tool also provides a mechanism for creation of stimulus events to be acted upon by the final theater and an event capture utility for recording and analyzing the results of the phenomenon's study. The Authoring Utility 1004 may use the Abstraction Window 305 and icons described above to generate the graphic representation of the user's desired process.

Some aspects of the present invention provide a "front-end" to any number of commercially-available reconfigurable platforms. These platforms have been brought to the marketplace for use as logic emulation systems. Their single largest application is in the verification of the integrity of the design of integrated circuits. These systems are available from several vendors serving the EDA (Electronic Design Automation) industry. One or more of these systems serves as a target platform for embodiments of the invention. A computer workstation (such as workstation 104) suitable for use with the target platform is also to be provided.

Since the output of the distiller and director utilities may be machine-independent text files, aspects of the invention may be operated on any suitable computer and use nearly any computer operating system. The output of the distiller may be, in some embodiments, the DBG output from step 603, and may be a hardware-level description of a configuration that may carry out the user's desired process.

A method of communications between the target platform's workstation and the computer hosting aspects of the present invention may need to be provided, unless the target platform's workstation is also hosting these aspects. For example, and as discussed above, several theaters may be implemented on different pieces of reconfigurable hardware, with communications between the two reconfigurable hardware platforms.

It is first important to understand that the invention may be more than simply a new "programming language." Embodiments of the invention may provide a fundamentally new and unique methodology for researching physical phenomenon that dismantles the differentiation between the "theorist" and the "experimentalist."

Traditional scientific method relies upon the theorist to create highly simplified models of an expected behavior that largely are analyzed outside the real-world domain (and its inherent complexity) in which the subject of the study would normally exist. Once the theorist determines the mathematical model of the expected behavior, the experimentalist contrives some suite of controlled environment, conditions and instruments to prove or disclaim the accuracy of the theoretical model. This process is repeated, continually adding complexity to the model until it is believed to match the real-world behavior of the phenomenon under study.

A simulation of the theory using conventional computational techniques may be performed prior to the experimental activities to reduce the cost of research by limiting how many times the experiments must be run. These traditional methods are best described as event-driven cycle simulators.

While their results are often quite accurate, the actual computational process is very slow. Embodiments of the present invention allow the distillation of complex, but well understood, phenomenon into behavioral models. The behavioral models, very highly abstracted entities, are then combined with the new model under investigation, to allow highly deterministic and non-granular analysis of the entire phenomenon under study.

Figure 11A:
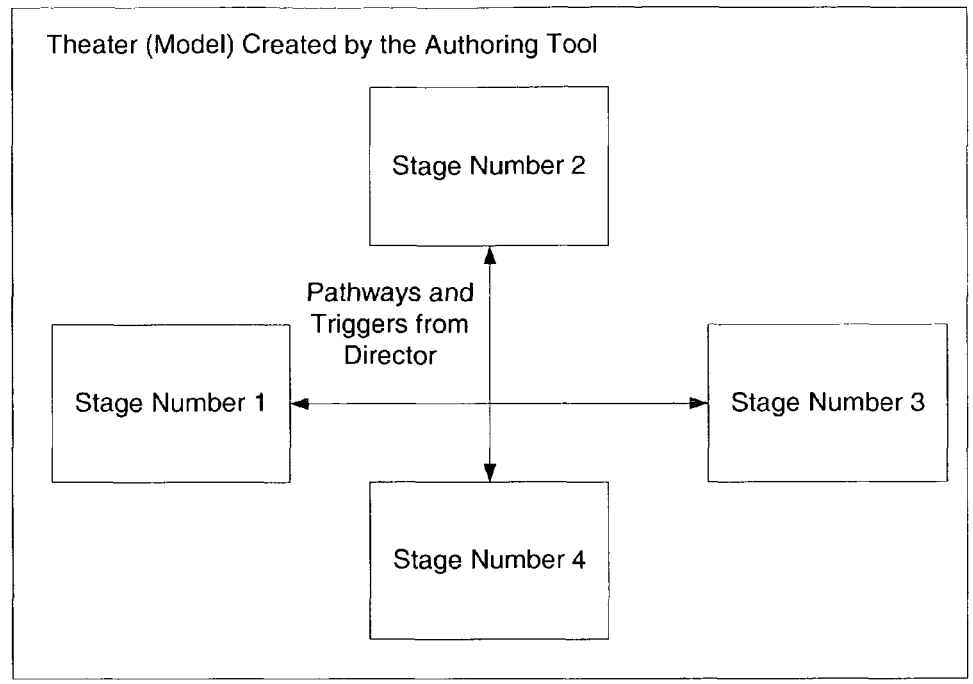
FIGS. 11a and 11b illustrate block diagrams showing communications in an example embodiment.
Figure 11B:
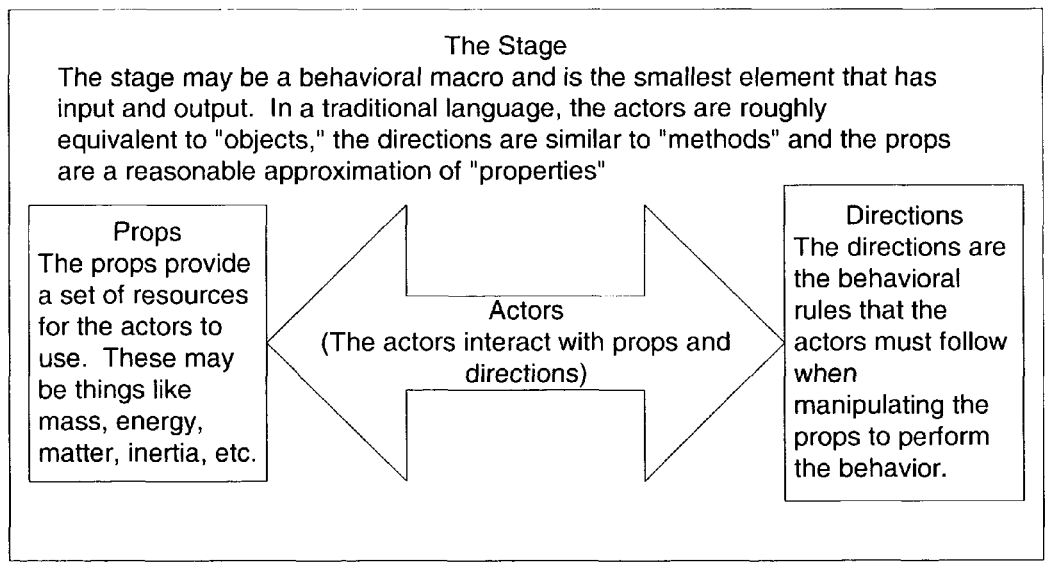

Using some aspects of the present invention, the theorist is given a suite of tools that allows rapid and accurate replication of the actual experimental environment (as known behaviors) and may then trigger and observe the phenomenon to be studied as it performs in this virtual environment. FIGS. 11a and 11b illustrate block diagrams showing how various stages may communicate with one another within a theater, and how props, actors and directions may interact on a given stage. Thus the effects of the environment on the subject are readily observed and may be quickly analyzed thereby allowing fast changes to the subject model and the event quickly studied again.

In some aspects, the invention may operate in a mode analogous to a theater. Within this theater are collected a number of "stages." The stage is representative of a collection (suite) of both known and unknown actors who perform the behaviors to be studied. The "unknown" actor may be a special construct that performs a place-keeping role, and may have its own graphical icon as discussed above. It may be embedded within a stage, and may have a data collection pipe to other algorithms and/or processes. It can be used to represent a phenomenon that is not well understood, and provides a place where neighboring, understood phenomena direct their outputs, giving the researcher a method of collecting stimulus information that may be later used to "flesh out" the incompletely understood phenomenon. The Code Database 109 may also store code segments defining the manner in which the unknown actor may react to this data (e.g., defining the frequency of data sampling, providing an output and/or event trigger signal upon receiving a certain data value, etc.), and these code segments may be used to instantiate the appropriate circuitry for reacting to the data provided by the rest of the stage.

The actors' behaviors are controlled by "directions" provided by the author via the director, and as represented in the netlist. These directions control the interactions between the actors and the time necessary for each actor to respond to the events or "cues" that trigger their individual behaviors.

Associated with the stages and actors may be resources provided in the form of "props." The props are analogues to real-world quanta be it energy, matter, or vector or scalar properties. Actors manipulate the props upon the stage in which they are set. Props may be of any reasonable level of abstraction, from simple, single data types to highly complex structures or collections of data.

Cues are the triggers that start the performance on any particular stage. Cues may be data events or may be the introduction of a prop onto a stage. Cues may be supplied by outside stimulus or may be generated by the performance on another stage. Cues may also interrupt or modify the behavior acted out on any stage. In some embodiments, these cues take the form of the various event trigger signals described above.

The stage is the variable level of abstraction. Upon the stage the actors, props and cues perform any given behavior. The stage may be organized as highly specialized or simplistic, performing a single behavior by a single troop of actors. Or, the stage may be generalized, sweeping several smaller stages into a single macro-behavior.

The author (researcher) may collect and/or create known stages (behaviors) and use them to assemble a test library. Most of these would be previously proven valid stages. They may be left intact where all internal interactions are executed or may be graduated to higher levels of abstraction where they are dealt with only as high-level behaviors thereby causing them to use fewer resources and quickening the execution time. By surrounding an "unknown actor" with well-understood stages, the researcher may provide sufficient data during hardware-accelerated simulation to create an effective behavioral model of the unknown phenomenon. This behavioral model may then be used, later, to derive the algorithmic behavior of the phenomenon under study.

The author may define a new stage for the phenomenon to be studied by collecting actors and props onto the stage using PPML. The author may then define the timing and behavior of the stages' contents though the use of cues and directions. Once all the stages are created or collected, the author gathers them into a theater and forms their interrelations using cues.

The theater may be passed to the distiller where the PPML is redefined as HDL constructs suitable for the target platform. The HDL may then be transferred to the target platform's host computer for synthesis into target primitives and execution.

Figure 12A:
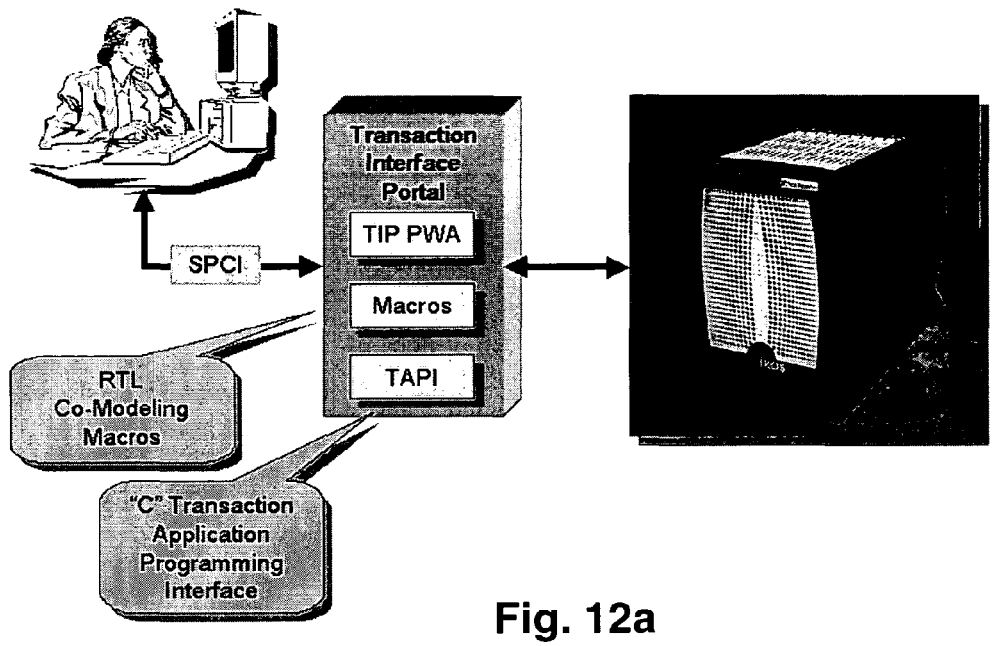
FIGS. 12a and 12b show block diagram examples of how some embodiments of the present invention may interface with target hardware.
Figure 12B:
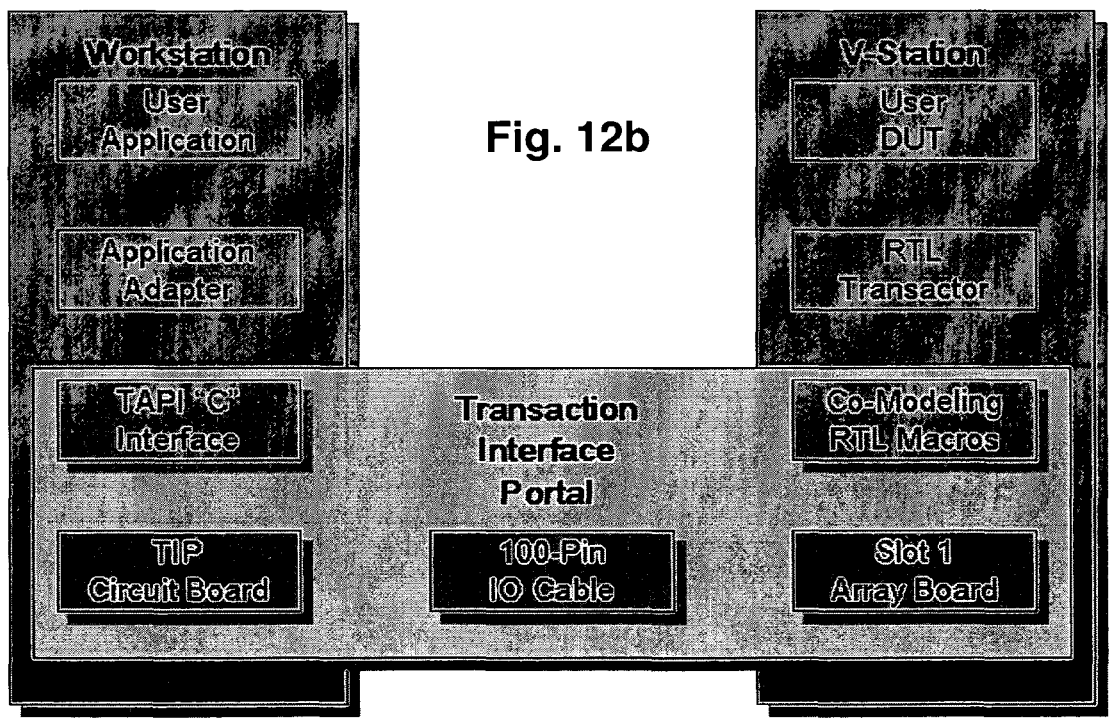

It may be helpful to address how this embodiment interacts with a target platform. The target platform, regardless of its manufacturer, may essentially be viewed as a collection (albeit a very large collection) of individually reconfigurable electronic devices, such as field-programmable gate arrays (FPGAs) that are preconfigured into an array or "fabric." Some switching and/or multiplexing of the IO's of these devices allow for the dynamic reconfiguration that makes some aspects of the invention possible and attractive. The mechanism for switching and/or multiplexing is generally proprietary to the individual manufacturer and is, essentially, irrelevant to the performance of many aspects of the invention. FIGS. 12a and 12b show block diagram examples of how some embodiments of the present invention may interface with target hardware.

The individual stages (behaviors) composed by the author using PPML may be distilled into HDL and then stored for later injection into a theater. Since all the PPML constructs distill into HDL, regardless of their mathematic complexity they will ultimately synthesize into gates or target primitives. Some commercial logic emulation systems do not provide traditional "gates." Instead, their designs implement a number of standard "primitives" that have predefined structure and work from a parameter list. The Mentor Graphics VStation emulator is an example of this method. At high levels of abstraction the resultant use of target primitives is minimized because behaviors need not be calculated in execution, they may simply be triggered outputs of tables. As the abstraction of the problem drops, additional target resources may be required to support processing with combinational logic or iteration rather than table lookup.

The dynamic interconnections, or cues, may then be synthesized and the result is a theater, or monolithic block of HDL that may be passed to the target platform for final compilation and ultimate execution in hardware. The cues may be dynamic in that they contain an op-code (operation defining code) that controls the behavior of the event processor on the target stage. Thus, the results of a computation may alter the behavior of another stage by providing flexible cues to downstream stages.

Since all the stages may remain independent, though communicative, elements, execution of parallel performances within the theater may actually be synthesized as parallel blocks of logic and therefore perform very fast.

Further enhancing performance, since the vast majority of stages in any theater will be previously proven behaviors, they may be precompiled and stored. As changes are made to the behavior (phenomenon) under study only those things that change need be distilled again. This dramatically reduces the time necessary to incorporate change, making it predominantly dependent upon the target platform's recompilation time.

Since the individual stages and theaters may be asynchronous behaviors that interact only upon demand, it is possible, indeed practical, to construct extremely large behavioral models of physical phenomenon that exceed the capacity a single target by simply using multiple targets (theaters). Since the individual theaters need not be synchronized by anything other then transmitted cues or props, the difficulties normally associated with "multi-box" solutions are eliminated. Since props and cues are comparatively small data elements, they may be quickly and easily transmitted between theaters either by direct connection of the target hardware's IO facilities or over a communication network, such as a Local Area Network (LAN) or Wide Area Network (WAN).

Figure 13:
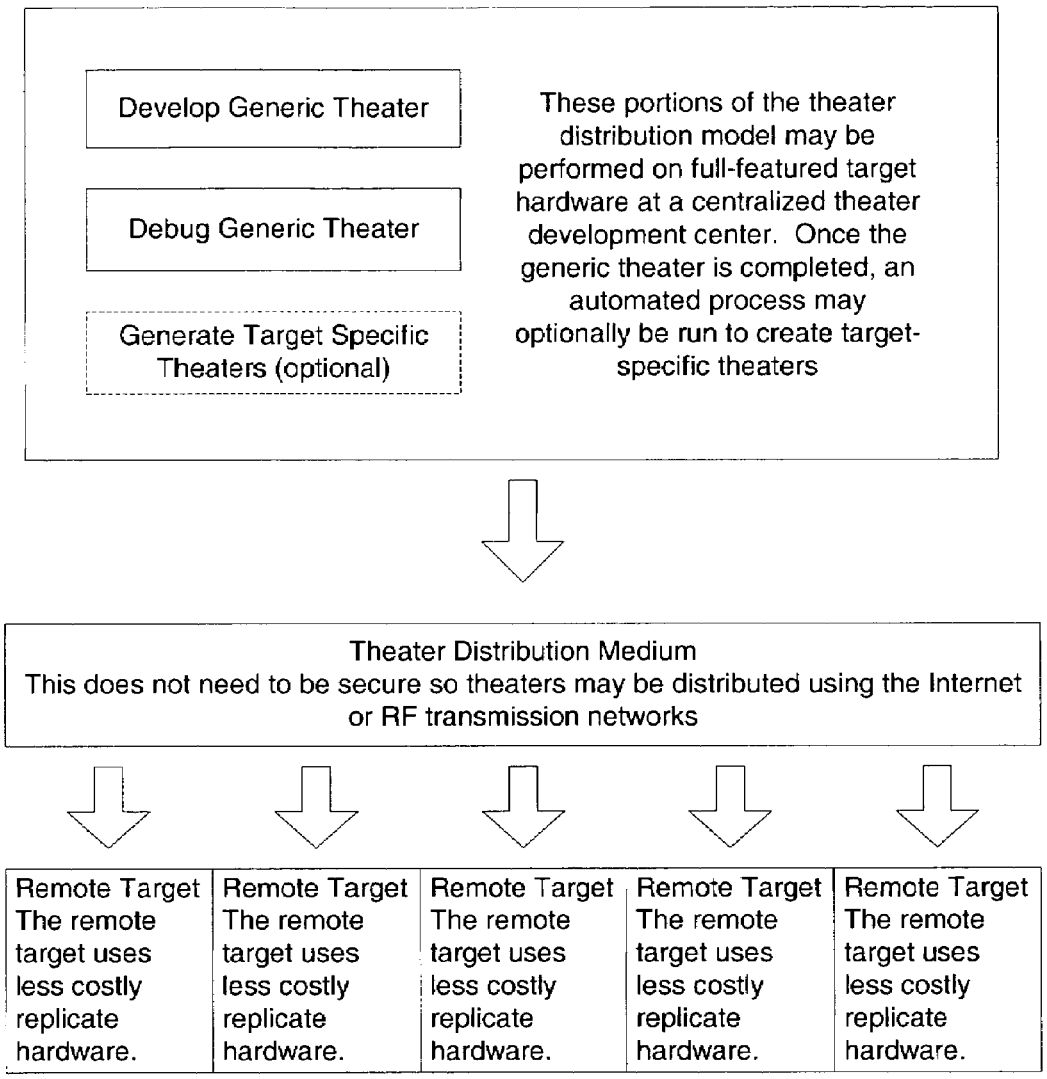
FIG. 13 illustrates an example of a model for the distribution of a theater according to some embodiments of the present invention.

FIG. 13 illustrates an example model for the distribution of a theater. First, a generic theater may be developed. Then the generic theater is debugged and, optionally, one or more target specific theaters may be generated. The theater(s) may be distributed to one or more remote targets via a network, such as the Internet or RF transmission networks. By making the theaters "target specific," any theater intercepted during transmission cannot be reverse-engineered or executed without the target platform; thus, a high level of security can be provided when desired. Plural generic (or "target specific") theaters may be selectively distributed to remote target platforms for operating in conjunction with, or independently of, the other distributed theaters. The distributed theaters may be identical to, or different from, each other, depending upon the distributed modeling requirements. Each of the remote targets may include replicate hardware as is commercially available, such as those from Mentor Graphics Corporation. The replicate hardware is less costly than a primary theater development system (development platform) and is more secure because replicates do not require debugging facilities.

The physical phenomena modeling example may involve research, such as the following hypothetical example. Assume a theoretical researcher at "National Laboratory A" has developed equations which promise a mechanism for reducing decay rates in doping materials used for semiconductor fabrication. The implications if the theory can be proved correct would be that new devices could be fabricated which require substantially lower activation energies and therefore lower power consumption. However, the laboratory has no facilities for experimentally proving or disproving the simplified theory and certainly no resources for demonstrating it in far more complex environments.

Using an embodiment of the present invention, integrated with a Mentor Graphics Corporation V-Station/30M logic emulation system, the researcher constructs a theater where one of its internal stages is the new decay model he has devised. Since the stage emulates the behavior of the new phenomenon in massively parallel hardware, the researcher is able to use machine generated test vectors to test the theory with several million vectors which represent the probable range of external stimulus that the theory would be experiencing in a real-world application. The time necessary for these millions of vectors is only a few minutes. As unexpected perturbations appear in the theater's results, the researcher is able to quickly modify the model until flaws in the theory are corrected and the model appears consistent and accurate.

Now the researcher modifies the theater to include a number of additional stages having well known and proven behaviors that must be able to properly interact with the new decay theory if it is to have any commercial value. Again, the speed of the overall theater allows many millions of test cycles in a very short period of time (several hours). Again, unexpected variations in the results indicate that some environmental issues may be injecting unacceptable levels of chaos into the model. Unfortunately the laboratory does not have sufficient numbers of the V-Station target hardware to adequately test the theory against stages representing all interactions that may be causing the problems.

Figure 14:
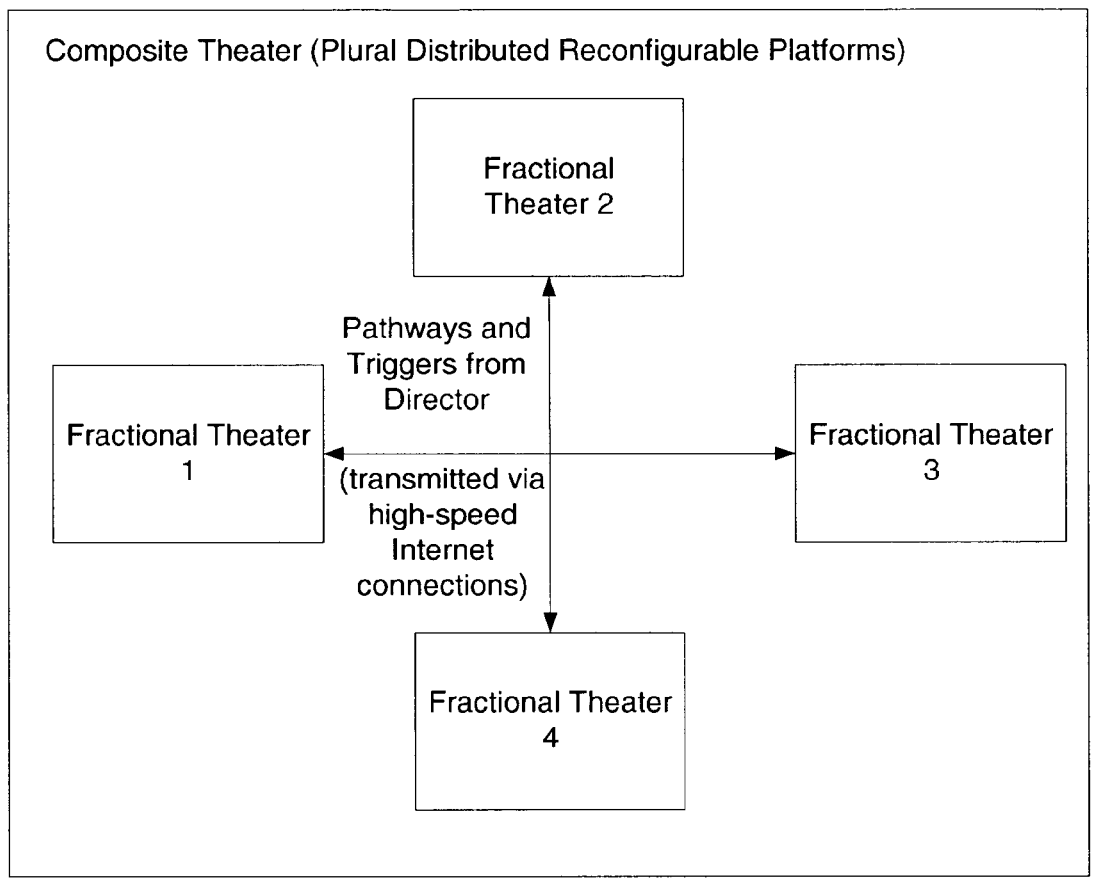
FIG. 14 illustrates a block diagram example of a collaborative distribution of theaters according to some embodiments of the present invention.

However, the researcher has collaborators at National Laboratories B and C with similar V-Station equipment. A new composite theater may be created that purposely exceeds the capacity of any one target hardware system but partitions the theater across three remote machines. FIG. 14 illustrates a block diagram example of such a collaborative distribution of theaters. The researcher's collaborators are each provided with a fractional theater where trans-theater pathways and triggers are transmitted via each target's host workstation. These three host workstations, separated, e.g., by hundreds of miles, interact via high-speed internet connections allowing the three dispersed systems to intimately collaborate and complete several million test cycles in just one day. The common circuitry 917 of each theater may also include circuitry to allow the various theaters to communicate with one another and share information. This circuitry may be as simple as Internet communication hardware, telephone line modem hardware, etc., and may allow multiple researchers to jointly execute experimental software algorithms.

Assume that the theater emulated test results support the validity of the new theory. Armed with verification of the integrity of the new theory, the researcher secures funding for an experimental production batch of integrated circuits, which upon physical fabrication and testing, provided final validation of the theory. The several flaws in the initial theory that were eliminated through machine accelerated testing would have required several attempts at the experimental device fabrication process before finally yielding the desired results. Not only would an iterative physical fabrication process have been very time consuming, the cost would have been significant. By using aspects of the invention, coupled with distributed machine collaboration, all involved laboratories are able to constrain costs and provide tangible value for the research investment in a dramatically shorter period of time.

Aspects of the present invention may also simplify the task of the theorist when a new process is needed. Once the initial algorithms have been created, and their icons are available, the theorist may easily modify the overall process by rearranging and/or modifying the existing algorithms. The user may open the process in Abstraction Window 305, and may insert/delete/rearrange the icons to modify the process, and may then simply request that the system recompile the process to provide a new downloadable file for the target hardware. If minimal data dependencies are present, the Spatial Architect may instantiate the circuitry in the target hardware as a massively parallel circuit to provide the fastest operation possible.

Accordingly, in using aspects of the present invention to model the behavior of physical phenomena, the following example aspects become apparent. First, reconfigurable platforms have been traditionally marketed and supported exclusively as EDA tools, specifically tools for the verification of custom integrated circuit designs. This embodiment introduces a novel application for this technology: physical sciences research.

Second, the embodiment introduces the concept of a non-procedural language specifically engineered for the study of massively-parallel physical phenomena.

Third, the embodiment introduces the concept of arbitrary range and precision floating-point data representations in hardware.

Fourth, an aspect of this embodiment is that, since the system may generate code for a variety of platforms, it supports portability under the OpenMP suite of standards.

Fifth, the embodiment introduces the concept of distillation of content across high-level languages, thereby increasing economy by eliminating the need for mission-specific or platform-specific compilers. This makes it possible to use embodiments of the invention on nearly any suitable target platform without any need to alter the target or its supporting software.

Sixth, the embodiment breaks down the barrier between the theorist and the experimentalist by providing a tool that allows the theorist to prove and adjust theoretical predictions in a complex environment prior to passing it off to an experimentalist for testing.

Seventh, the embodiment is applicable to modeling of any physical phenomenon. This allows marketing of the target platforms into applications previously closed to the EDA industry, e.g. chemical manufacture, aerospace, and geophysical exploration industries. Utilizing a plurality of distributed (networked) reconfigurable target platforms, each forming a fractional theater, a researcher in one location can create a very large composite modeling theater exceeding the capacity of any one target platform. Alternatively, centrally-developed theaters, which may be the same as, or different from, each other, can be distributed to plural researchers in different locations, for carrying out modeling of related phenomena, e.g., location specific phenomena such as weather or geophysical phenomena, or entirely different phenomena.

Example

Signals Intelligence Analysis (SIA)

The second exemplary field deals with the concept of signals intelligence analysis (SIA). SIA refers generally to the analysis of incoming data in an attempt to detect known patterns, which may be helpful in areas such as decryption, or code breaking. As the sophistication of signals encryption devices continues to grow (both commercially available devices and those usually only available to governments) the effort necessary to intercept, decrypt and extract intelligence from these signals expands at a similar rate. The end of the "Cold War" has, if anything, made the problem even more difficult because it has dramatically altered the scope, nature and diversity of the threats to National Security.

Traditional, centralized, signals intelligence is no longer a methodology of sufficient performance and response to satisfy both the real and perceived (by the national leadership and citizenry in general) demands for threat detection and response. While terrestrial and space-based listening posts offer adequate means of capturing raw signals, the need to retransmit them to a central processing facility and then wait for the queue at that facility is becoming increasingly unacceptable. Even with the massive collections of computational platforms available to government entities, the response time of centralized systems is inadequate to respond to developing threats in anywhere near real time.

The concept of distributed processing or reliance on allied assets to improve the bandwidth of this system, using conventional methodologies, is also problematic. Placement of advanced technology computational platforms and their required operational software at remote and/or volatile locations places national security at risk because the equipment may be physically compromised and reverse engineered. Reliance on allied assets could promote unacceptable dependency on resources that may not always be allied.

Some embodiments represent a unique application of both existing technologies (massive FPGA-based logic emulation systems), such as described in U.S. Pat. Nos. 5,596,742; 5,854,752; 6,009,531; 6,061,511; and 6,223,148, the disclosures of which are incorporated herein by reference, and new application specific language and compiler technology. U.S. Pat. Nos. 5,036,473 and 5,109,353 also describe technology to which the present invention may be applied. The use of commercially available reconfigurable computational platforms provides nearly immediate availability of necessary hardware resources at reasonable costs. One reconfigurable platform, the Mentor Graphics Corporation's V-Station family of logic emulation systems, uses a binary download file to reconfigure the equipment. The methodology used to develop and distribute the download files for this type of platform is highly secure in that it is impossible to reverse-engineer the binary images into even a close approximation of the original intermediate HDL code, let alone the original development language source code.

Further contributing to the difficulty of reverse engineering sensitive information from captured data files or the physical equipment is the fact that the "field based" equipment may be physically different from the "development" equipment. Thus, capture of the field based equipment may do no good because it physically cannot extract its own programming. In many instances, switching off the power causes its configuration to permanently disappear, and the binary images files that may be compromised will only execute on the one and only system for which they were originally targeted. The overall system is inherently highly secure.

The next problem addressed by this embodiment of the present invention is that of the physical distribution of the necessary hardware and software. Unlike many other reconfigurable platforms, the target V-Station/30M system is quite small, surprisingly small given its capacity. The dimensions of the equipment are approximately 1 m in depth, 500 cm in width and 650 cm in height. The physical weight is approximately 170 kg. The equipment will operate on quite reasonable electrical supplies (200 to 250VAC at 50 or 60 Hz, no more than 12A) and is readily "ruggedized" for shipboard applications and does not require permanent mounting. Thus the equipment necessary to make use of aspects of the invention may be distributed to nearly any location worldwide.

Unlike other hardware-based signals intelligence solutions, embodiments of the invention may use the reconfigurability of the target hardware to maximize the flexibility of the solution. Depending upon the capacity required for each implemented decryption algorithm, the embodiment may support multiple (e.g., from one to nine) concurrent solutions in each chassis, each operating independently of the others. The installed solutions may be easily changed from download files stored on optical or magnetic media with a turn-around time of approximately thirty seconds to two minutes (depending upon the size of the solutions being downloaded to the equipment).

Another advantage is that, unlike decryption solutions based on software algorithms running on conventional computational platforms, the solution may be configured into massively parallel, dedicated hardware using various aspects of the present invention. The solution will run orders of magnitude faster than it would in a typical general-purpose computer, even an extremely powerful one. Thus, the invention allows decryption performance to be nearly as high as it would be if custom fabricated integrated circuits were used, but without the inherent risks of compromise such solutions must live with. The performance to cost ratio is extremely high because solutions may be developed and distributed at a small fraction of the cost of custom device based solutions.

Distribution of solutions is simplified because there is no need for distribution over secure channels. Without the actual target hardware, an intercepted solution would be useless since it cannot be reverse engineered. Even if the hardware were compromised and a solution captured, the solution will not execute in some embodiments, such as those that implement authentication such as RSA Corporation's SecurID protocol, unless the operator has the necessary password and security token to download the solution. This allows each physical site to maintain thousands of solutions and allows distribution of new solutions over any suitable data transfer medium very quickly.

The next problem addressed by the embodiment is the simplicity of solution development. Unlike methodologies that require the cryptographer to develop solutions in either a HDL or conventional programming language (such as C, C++, Fortran, ADA, etc.) the cryptographer may work in a very high level language unique to the invention specifically engineered for signals intelligence applications. The development environment allows the cryptographer to "drag-and-drop" modular sub-solutions into the solution under development, connecting them into parallel architectures thus taking advantage of the massively parallel nature of the target equipment.

Figures 15A, 15B:
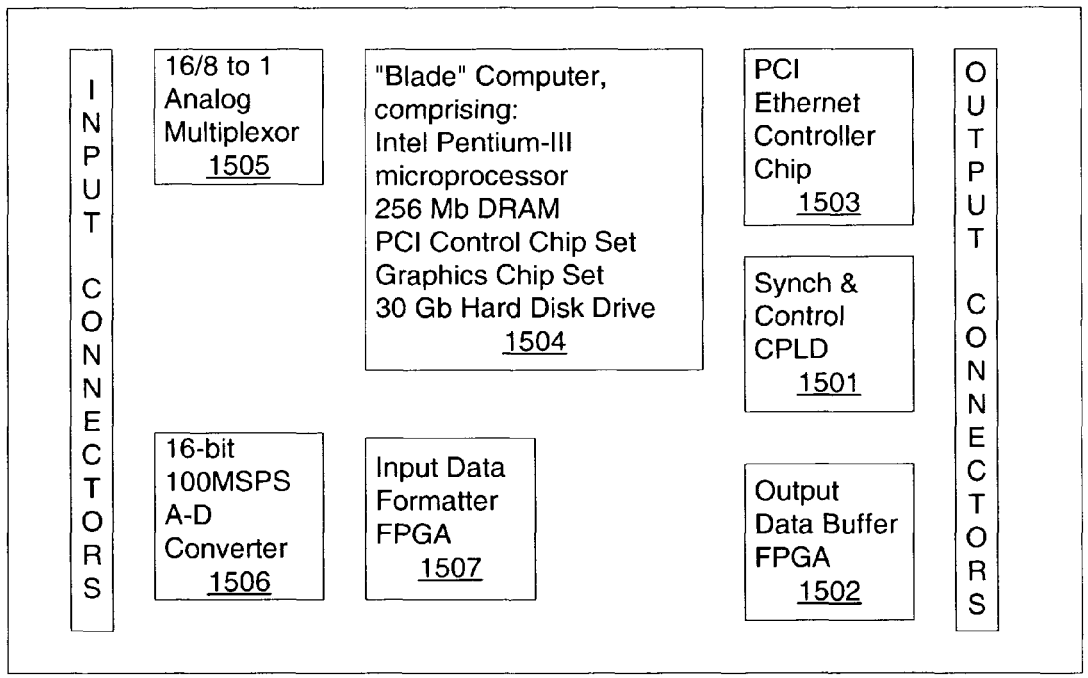
FIGS. 15a and 15b show examples of block diagrams of hardware and port configurations that may be used in some embodiments of the present invention.

FIGS. 15a and 15b illustrate an example General Purpose Analog Front End (AFE) that may be used with various embodiments of the present invention. This device may include nine equivalent ports (e.g., channels), each channel being connected to a reconfigurable hardware platform, and each having sixteen single-ended or eight differential analog inputs. Each input may receive intercept data in real-time, digitize that data, and buffer it onto a hard disk drive. As the digitized data is captured onto the hard disk it may be pulled off the disk (in what may be a FIFO buffer arrangement) and synchronously passed to the target reconfigurable hardware platform at the limiting frequency of the most complex solution currently loaded into the target hardware. The AFE therefore acts as a "speed bridge" converting the asynchronously arriving intercept data into synchronous information more easily managed by the solution(s) currently loaded.

Each port/channel shown in FIG. 15a may be connected to its own reconfigurable hardware circuit, and may have the components shown in FIG. 15b. The Synch & Control CPLD 1501 may communicate directly with the target hardware running a solution and select which channel data to download to the target hardware and synchronizes the flow of that information with the target hardware's clock via the provided IO facilities. The output data buffer FPGA 1502 may accept data for the selected channel from the Blade microcomputer and clock it out to the target hardware. A large block of internal resources may be reserved to allow the cryptographer to incorporate a reasonable level of digital signal processing to the data before passing it on to the target hardware.

The PCI Ethernet controller chip 1503 can manage 10/100Tx Ethernet communications between the Blade microcomputer and a networked utility computer used for programming and monitoring operations. The Blade microcomputer 1504 may provide high performance local, conventional, computational and mass storage resources to the port.

The Analog multiplexor 1505 may be software controllable to act as either an 8-channel differential input device or a 16-channel single ended device. A 4-bit channel select port may be used by the Blade microcomputer 1504 to select the active port. This may be advantageous in embodiments in which only some (or one) of the ports may be active at one time. The multiplexor coordinates the timing and sharing of resources between these ports. Since the ports may operate at speeds up to two orders of magnitude above the emulator hardware, this "scanning" of the active port is not a problematic restriction.

The 16-bit Analog to Digital converter 1506 may be a 100 MSPS (mega-sample per second) device that converts the raw analog input on the selected port to unprocessed (raw) 16-bit digital words for transport to the buffering services on the hard disk drive.

The Input Data Formatter FPGA 1507 may accept the raw 16-bit data from the A-D converter 1506 and restructure it for acceptance by the microcomputer 1504. A significant block of internal resources is left available to the cryptographer to allow a reasonable level of input digital signal processing.

Figure 16:
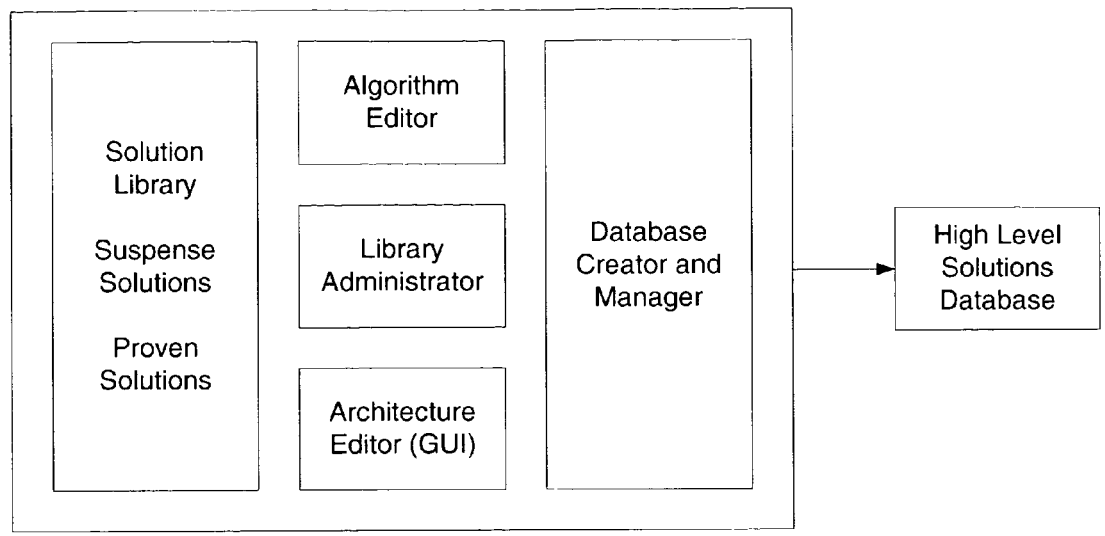
FIG. 16 illustrates a block diagram embodiment of an Algorithm Development Environment (ADE) according to some embodiments of the present invention.

FIG. 16 illustrates a block diagram embodiment of an Algorithm Development Environment (ADE). This may be a graphical user interface tool that allows the cryptographer to define libraries of solutions or solution fragments and assign each to an iconic representation. These solution representations may then be placed onto an architecture sheet and related to each other with data pathways and event triggers. Thus, highly elaborate, parallel solutions may be constructed without the need to hard code each solution. The output of the ADE is a high-level database that is then translated by the behavior generator. In some embodiments, the ADE uses workspace 300 and Abstraction Window 305.

Figure 17:
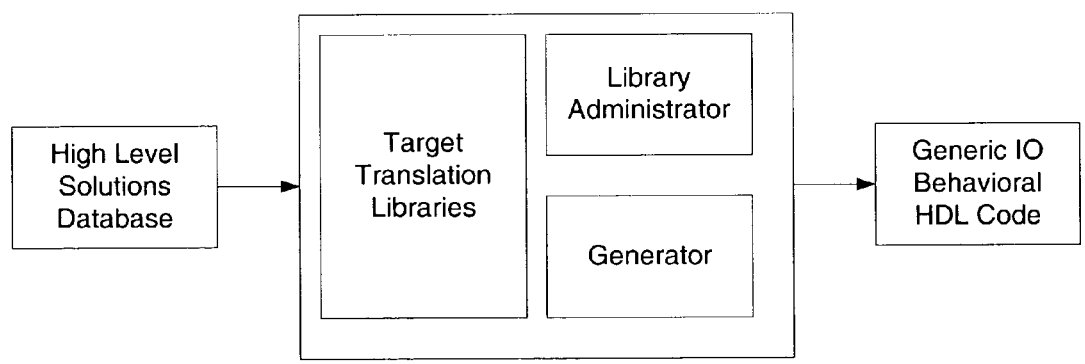
FIG. 17 illustrates a block diagram embodiment of an example of a Behavior Generator according to some embodiments of the present invention.

FIG. 17 illustrates a block diagram embodiment of an example Behavior Generator. The Behavior Generator may operate as a translation utility, accepting the ADE's output database and translating it into behavioral VHDL. Optionally the behavior generator may create its output in RTL (Register Transfer Logic) depending on the level of efficiency required for the final solution. The output of the behavior generator may be devoid of pre-defined IO elements to allow downstream combination with other solutions.

Figure 18:
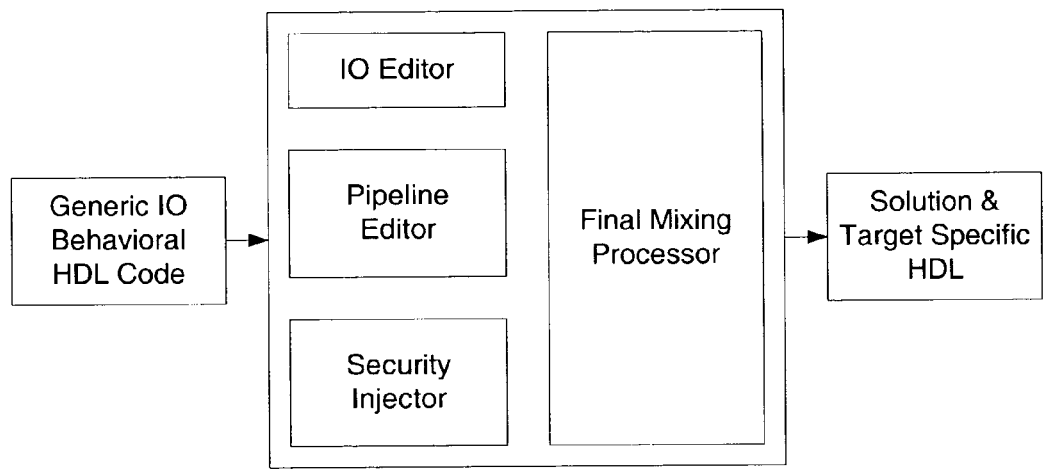
FIG. 18 illustrates a block diagram example of a Solution Mixer according to some embodiments of the present invention.

FIG. 18 illustrates a block diagram example of a Solution Mixer. The solution mixer may be viewed as a utility that restructures multiple solutions into a single monolithic block of RTL or VHDL. While restructuring the solution(s) the IO elements are created and either pipelines between solutions are created or discrete IO's to the analog front end or ports to the target hardware IO connectors are injected into the code. The output is a single entity that is compatible with the target hardware native compiler. The solution mixer may also inject the design elements that are required to prevent unauthorized execution of the design. In some embodiments, the solution mixer performs the Spatial Architect steps described above and shown in step 604, and may be implemented in the same or similar fashion.

The model shown in FIG. 13 may also apply to the SIA embodiment. As shown in that Solution Distribution Model, first, a generic solution may developed. Then the generic solution may be debugged and one or more target-specific solutions may be generated. The solution(s) may be distributed to one or more remote targets via a network, such as the Internet or RF transmission networks. By making the solutions "target specific," any solution intercepted during transmission cannot be reverse engineered or executed without the target platform; thus, a high level of security can be provided when desired. Plural generic (or "target specific") solutions may be selectively distributed to remote target platforms for operating in conjunction with, or independently of, the other distributed solutions. The distributed solutions may be identical to, or different from, each other, depending upon the distributed modeling requirements. Each of the remote targets may include replicate hardware as is commercially available from vendors such as Mentor Graphics Corporation. The replicate hardware is less costly than a primary solutions development system and is more secure because replicates do not have solution debugging facilities.

The cryptographer may use the ADE (Algorithm Development Environment) to construct a possible solution to the decryption problem at hand. This solution may be constructed from a library of proven solution fragments or from newly devised algorithms placed into a "suspense" library. Entries in the suspense library may be assumed to be unverified and their outputs set a "suspect" flag in any output registers. The suspect flag may be a hardware signal that, when asserted, indicates that there exists a level of risk in the integrity of the solution output. This allows the user to create flexible hardware with different behaviors based on the data. When a library entry is no longer suspect, it may be promoted to "proven" (e.g., when the solution has been demonstrated to be a valid solution to an encryption/decryption problem), and its outputs will no longer set the "suspect" flag in the output registers. At this point the solution is largely unstructured, in that it has not yet been through the final stages of instantiation.

Still using the ADE, the cryptographer may devise the data pipelines and event trigger paths that connect the individual library elements into a structured solution, such as by arranging and connecting graphical icons as discussed above. Using conditional constructs acting upon output register flags the cryptographer may graphically define flow control between the solution fragments to implement a final solution.

After defining the solution using the ADE, the cryptographer may use the behavior generator to create either an RTL or VHDL representation of the solution. The resultant behavioral representation of the solution has only generic IO connections defined.

Once the behavioral solution with generic IO's is complete, the cryptographer uses the solution mixer to combine multiple solutions and/or incorporate hardware-implementable IO paths into the combined solution, and may specify the desired I/O resources. The solution mixer then effects the combination of all solutions into a single monolithic block of code compatible with the target hardware compiler, as described above with respect to the Spatial Architect. Now, the cryptographer includes the identities of the target hardware that will be permitted to run the finished solution. The solution architecture may be presented to the user for acceptance, and the user may choose to modify it by, for example, moving graphic elements using a pointing device. When the elements are configured to the user's satisfaction, the user may indicate his/her acceptance via the user interface, and the Spatial Architect may call the other structuring tools to ensure the integrity of the input-output connections and present a netlist for downstream processing.

The output of the solution mixer may then be provided to the target hardware's native compiler, and becomes download files that are distributed to the authorized targets. Once the download files are distributed to the remote locations, the AFE is connected to the target hardware and then to the intercept data source and the solutions are executed.

This embodiment has been described primarily in terms of a signals intelligence application. The invention, however, is not so limited. Rather, the invention is generally applicable to the development and execution of solutions aimed at solving virtually any problem capable of mathematical definition.

The SIA embodiments described above include several notable aspects. First, prior work in the area of reconfigurable computing, as it applies to signals intelligence, has been limited to relatively small target platforms that are essentially "Turing Engine" or "Von Neumann" architecture processors with a small number of reconfigurable elements dedicated to simple digital signal processing (DSP) applications. These architectures are sequential in nature. Embodiments of the present invention may bypass the need for sequential processing in favor of massively parallel implementation of algorithms in reconfigurable hardware.

Second, several embodiments of the present invention introduce the concept of visual manipulation of iconified fractional solutions in a GUI (graphical user interface) environment for development of solutions, rather than requiring users to craft conventional, procedural programs using languages such as C, C++, Pascal, Delphi, ADA, Fortran, etc.

Third, some embodiments of the present invention introduce the concept of nested abstraction. This means that well-defined and proven solutions may be reduced to purely behavioral (as opposed to computational) models with "calculation intensive" elements embedded within or forming "wrappers" outside the behavioral models. In other words, once a solution has been deemed reliable, it may be implemented as a series of look-up tables producing a predefined output for a predefined set of inputs.

Fourth, some embodiments of the present invention introduce the concept of highly secure distributed computational nodes that are supported from a centralized development infrastructure. The trans-language nature of the download files combined with hardware security features renders compromised hardware or software immune to reverse engineering or even unauthorized use. This is a very secure system.

Fifth, the near impossibility of reverse engineering download files into meaningful source code allows for rapid deployment of new solutions over non-secure transmission media without compromising security.

Sixth, by using commercially available logic emulation systems as the target hardware, instead of custom platforms or custom integrated circuits, those embodiments of the invention may dramatically reduce the time necessary to release new solutions to in-field applications without significantly affecting solution performance.

Example

SIA-Imagery

Signals intelligence analysis, and the solutions and solution fragments described above, are not limited to encryption/decryption. Indeed, they may extend to any other area in which incoming data is reviewed for the existence of a pattern. The incoming data may be, for example, a stream of satellite imagery containing pictures of suspected military equipment in opposition forces territory. With the abundance of satellites and other forms of information-gathering equipment, millions of digital images may be generated every hour. The traditional approach to SIA would transmit such images to a centralized location for analysis. The traditional approach uses a centralized location partly because it is easier to keep a central location secure. This centralized approach suffers a drawback, however, in that the time required for the transmission and central analysis may literally mean the difference between life and death. A satellite image showing an advancing troop transport may be of little value if the SIA process recognizes the troop cargo ten minutes too late. There is therefore a need in the SIA field for a secure, rapid way to conduct this analysis—embodiments of the present invention provide such a way.

Furthermore, the traditional approach suffers another drawback in the time it takes to adapt its SIA process to changing conditions. In some instances, computer algorithms have been generated to detect, for example, a predefined shape in a given image. An algorithm may exist to detect a suspected machine gun mount on a vehicle, or the military markings of opposition forces. Analysts may spend thousands of hours writing the computer code for carrying out this algorithm, and if those opposition forces modify their tank barrels or change their military markings, the analysts may find themselves back at the drawing board. This process takes time—an unacceptably long time. Accordingly, there is a need in the SIA field for a faster way to create and/or modify computer algorithms to adapt to changing conditions.

These and other drawbacks may be addressed using one or more embodiments of the present invention. Using FIG. 5 again as an example, this process may be one that identifies a machine gun mounted on a light truck. MCT Input 501 may represent an algorithm that captures a particular image and stores it in a data structure represented by Image Data 502. Pass Filter 503 may be an algorithm previously developed to identify the machine gun and provide a copy of the original image with the suspected machine gun highlighted in color, and might provide an output event trigger signal only if a machine gun is detected. Pass Filter 505 may be an algorithm previously developed to provide a copy of the image with suspected light trucks highlighted in color, and might only provide an output event trigger signal if it detected a truck in close proximity to other highlighting (in this example, it would be the machine gun). MCT Output 506 may represent an algorithm that generates a warning message and forwards a copy of its input image to a predefined destination.

Using aspects described above, the user may graphically assemble the desired process shown in FIG. 5 from a library of predefined algorithms (in this case, a library containing at least the machine gun and light truck algorithms), and may request that the system automatically generate RTL code for configuring a target reconfigurable platform 101.

If the opposition forces now begin mounting a different size machine gun on the same light trucks, the user may need a new computer program. To generate this new program, the user may access a workstation to open the graphic representation shown in FIG. 5, click and delete the Pass Filter icon 503, and click and drag another icon in its place. This other icon, which may occupy the same place previously occupied by Pass Filter icon 503, may represent a different algorithm that has been written to detect the new size machine gun instead of the original one. After modifying the graphic representation, the user can once again request that the system generate a new block of RTL code and download it into the target reconfigurable platform 101. The code has been quickly modified, without requiring a computer programming analyst to rewrite the computer code.

As yet another advantage, target reconfigurable hardware platforms 101 may lose their configuration data if anyone attempts to steal a unit. These platforms may store their configuration data in a volatile memory to allow ease of update. When such systems are used, the particular configuration data may be lost if the system loses power, a feature that may be advantageous should a target platform fall into enemy hands.

The notion of secure transmission is pertinent to another example SIA application—data encryption/decryption systems. In such systems, a user may have a computer program that searches through streams of incoming, possibly encrypted, data in an attempt to decipher that data. The process of deciphering may involve applying a number of algorithms to the data to detect the presence of "interesting" data, or data elements that signify the possibility of encrypted data. Using the FIG. 5 example once again, in this embodiment MCT Input 501 may represent an algorithm that provides the stream of data; Pass Filter 503 may represent an algorithm that detects the presence of a first string of uninteresting data (e.g., a string of data that is known to be unencrypted), while a second Pass Filter 505 may represent an algorithm that detects the presence of a second string of uninteresting data. The overall process may operate to filter out all incoming messages that contain uninteresting data, leaving as output only those messages that potentially contain encrypted data.

The inherent security provided by the binary files may be helpful, for example, in updating a workstation's database of known solutions to encryption algorithms.

The interchangeability of the various algorithms allows the user to experiment with libraries of known decryption/encryption solutions to assemble new methods of encryption and/or potential decryption solutions. Fragments of known solutions may be represented by various icons, and may be assembled in various ways to create new algorithms.

Example Embodiment

Abstraction and Behavioral Models

Figure 19:
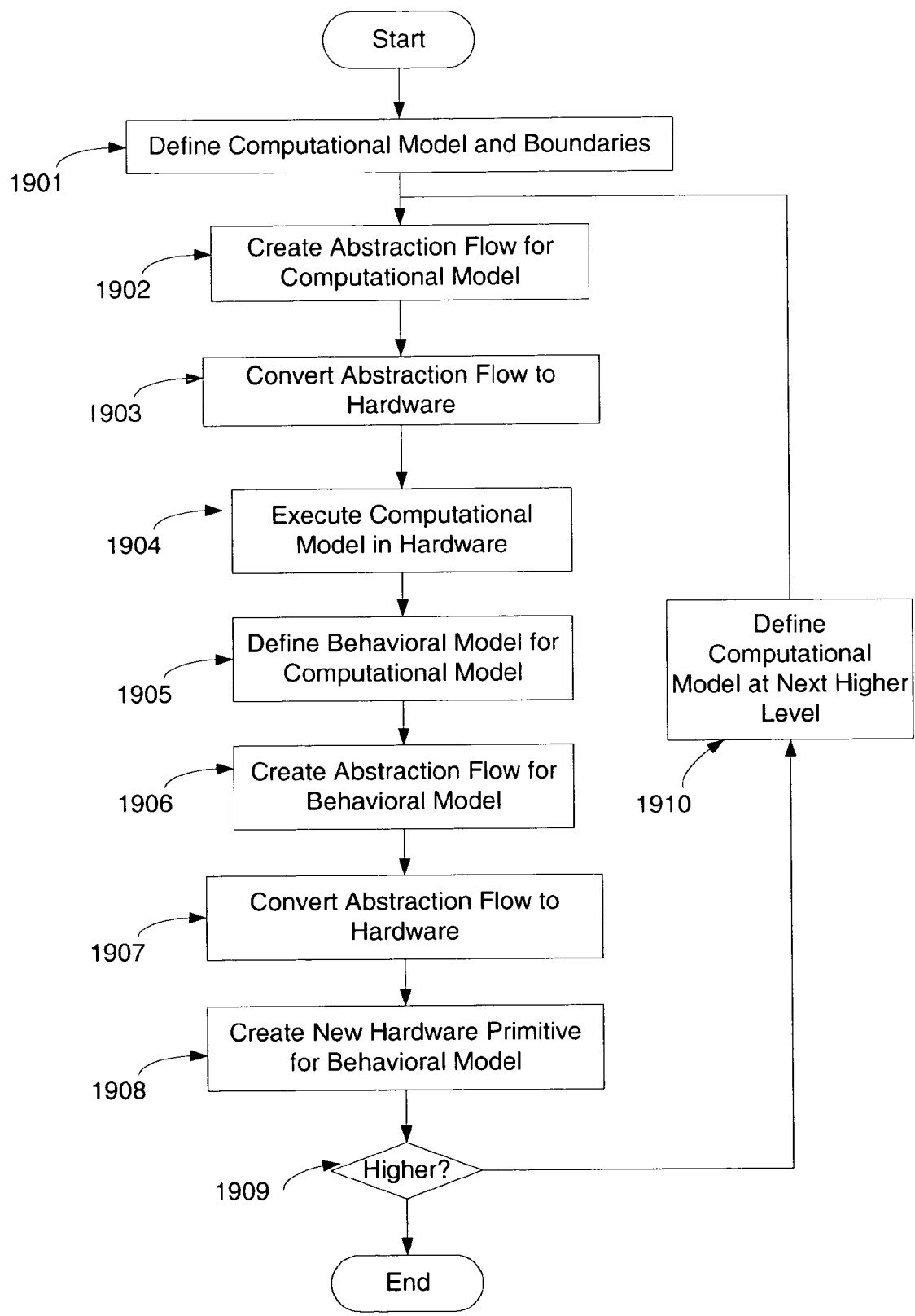
FIG. 19 illustrates a flow diagram of an example computational/behavioral modeling processing using one or more embodiments of the present invention.

FIG. 19 illustrates a flow diagram for another example embodiment and use of the present invention. The power and ease-of-use offered by various embodiments described above enable the simulation and modeling of various computational problems. For example, in step 1901, a user may define a computational model and its boundaries. Computational models are common throughout the research community, and are used to define a near-infinite variety of behaviors such as planetary orbits, gene sequencing, thermal conductivity, etc. For ease of explanation, the present discussion will use the following simplified computational model (although it will be understood that the teachings described herein may be applied to any computational model):

$$\int_0^\pi \sin(x+41)$$

The boundaries for a computational model represent the outer limits for the variables appearing in the computational model. In the illustrated example, the model is bounded by defining the value x to vary between 0 and $\pi$.

Once the computational model has been defined, the process may move to step 1902, in which the user may create an abstraction flow for the computational model. The abstraction flow may simply be a series of icons and interconnections as described above to represent the computational algorithm. In creating this abstraction, the user may rely on previously-defined algorithms. For example, the user may already possess in the library an icon corresponding to an algorithm for calculating "sin(x+41)," where x is a single input to the algorithm. The user may then use this icon, together with an integration symbol, to define an abstraction of the computational model that will compute the sum defined by the integral, and may provide as input to the algorithm the various boundaries of the model. The user may also define additional circuitry for capturing data samples during execution, and may define a data structure that will retain the output generated by each corresponding input.

In step 1903, the abstracted computational model may then be converted into code that may be used to configure hardware to perform the computational model. This conversion may use the Spatial Architect, architect, and/or Distiller/Behavior Generator described above.

Then, in step 1904, the code for performing the computational model may be used to configure a hardware platform, and the platform may begin its execution of the computational model. The calculations may be performed in hardware, and the circuit may capture the voluminous amount of input/output data values obtained during the process.

In step 1905, the output of the hardware's calculations may be reviewed. The data structure holding the various input and output combinations may be examined to discern patterns in the data. For example, the user may identify a step value in the input values in which an output value's change is insignificant (e.g., the outputs for an input of 0.001 and 0.002 are so close that they can be treated the same). The data structure may also be used to define a lookup table identifying the corresponding output for each given input. This lookup table may then serve as a behavioral model of the computational model, and may produce equivalent results in a fraction of the time since a look up process can be handled in hardware much faster than a computational process. The tradeoff, of course, is that the lookup table may require significantly more memory/circuit real estate to implement.

In step 1906, the user may once again define an abstraction flow, although this time for the behavioral model developed in step 1905. The behavioral model abstraction flow may include a variety of look up operations using data structures, and may include additional logic to simplify the lookup process.

In step 1907, the user's abstraction flow may be processed (again, this may be done by the Spatial Architect, architect and/or DBG discussed above) as described above to produce computer code for implementing the new behavioral modal. In step 1908, this code may then be added to the Code Database 109, and a new hardware primitive may be defined for the behavioral model. The primitive may include a new icon with handles, such as icon 401.

In step 1909, the user may determine whether the particular algorithm that was abstracted may be used in a larger process occurring at a higher level of abstraction. For example, the integral function described above may in fact be just a small piece of a larger process or behavior. If a higher level of abstraction exists, then the process may move to step 1910, in which the user may define the computational model for the higher level process or behavior, as well as the boundaries applicable to that higher level, and the process may then return to step 1902 to allow the user to define an abstraction flow for the higher level of abstraction. In this recursive manner, scientists and researchers may begin with a lower level, simplified, computational model, instantiate it in hardware to obtain results for creating a behavioral model, replace the computational model with the behavioral model, and repeat this process for a more complicated (e.g., higher level of abstraction) process. As this process is repeated, more and more complex computational models may be replaced by behavioral models that can be instantiated in hardware, which may execute much faster than the computational models could.

Figure 20:
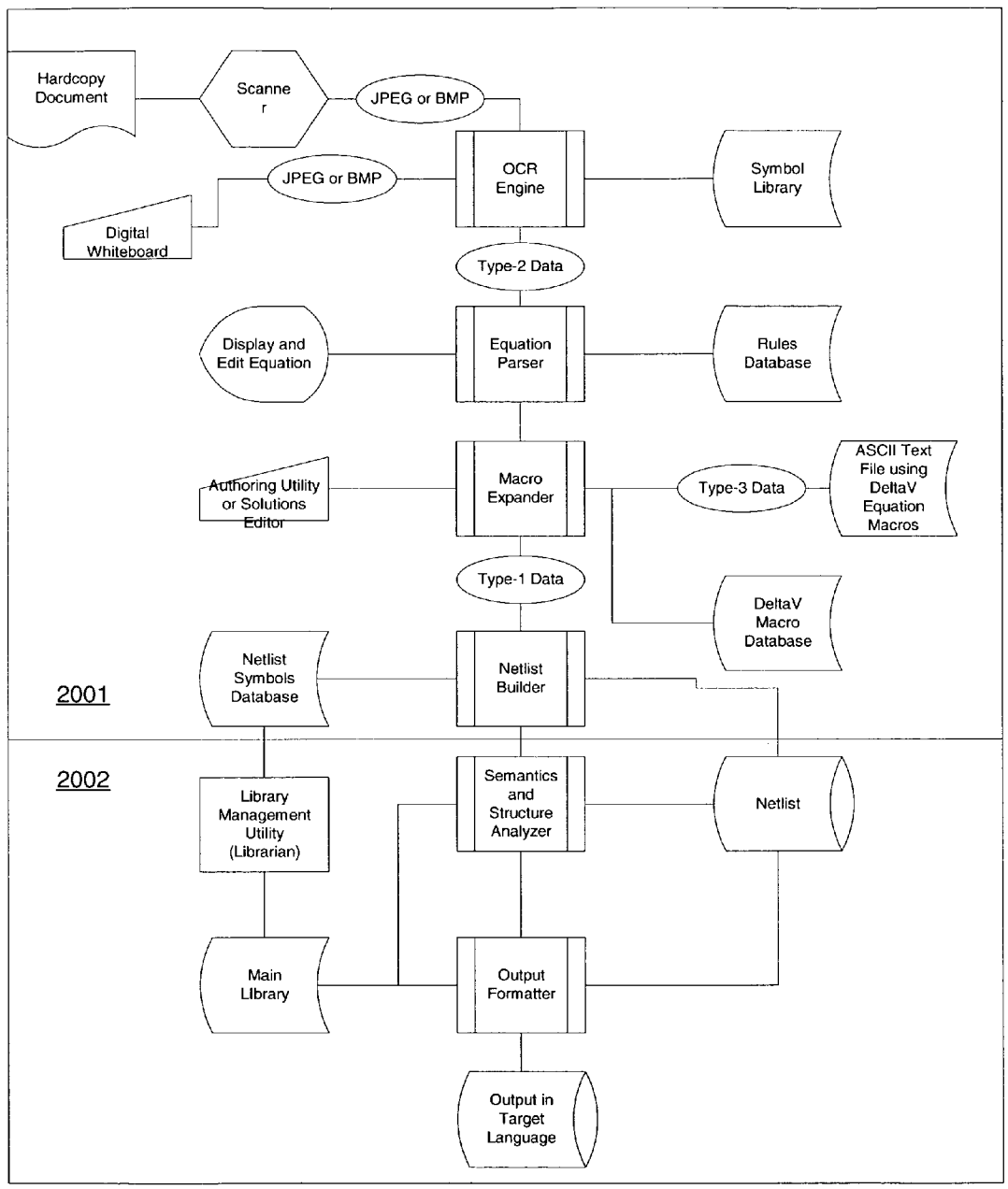
FIG. 20 illustrates an example of a block diagram showing relationships between various elements used in some embodiments of the present invention.

The discussion above introduces a number of concepts, aspects and features that may play a role in various embodiments of the present invention. FIG. 20 shows a high-level, overall diagram illustrating how many of these features may fit together in one or more embodiments. As shown in FIG. 20, the various elements in the upper portion 2001 may have an interface to the Authoring Utility or the Solutions Editor, and additionally, the front-end of the Distiller-Behavior Generator may be coupled to this section. The lower portion 2002 may be coupled to the back-end of the Distiller-Behavior Generator and the Spatial Architect.

The various embodiments and aspects described above are intended to provide examples of the concepts included in the applicants' inventions. It will be understood that minor deviations from the described embodiments are still within the scope of applicants' conception. For example, alternative combinations and subcombinations of the various aspects and embodiments described above may be made without departing from the concepts and teachings described herein. The true boundaries of the inventions claimed herein will vary depending on the claims made to this disclosure, which appear as follows:

We hereby claim the following inventions:

1. A signals intelligence analysis method, comprising the steps of:

storing a library of iconic representations of image detection solution fragments in a memory, said solution fragments corresponding to different image components;

placing a plurality of said iconic representations in a graphical user interface;

connecting said iconic representations with one or more data pathways to graphically define flow of data between the solution fragments and to represent a solution, wherein said solution identifies the presence of said plurality of image components in an input image;

converting said iconic representations and said one or more data pathways displayed in said graphical user interface into a behavioral representation of said solution; and using said behavioral representation to configure a reconfigurable platform to detect the presence of said plurality of image components in an input image.

2. The method of claim 1, wherein at least one of said one or more data pathways includes event trigger information.

3. The method of claim 1, wherein said step of converting further comprises the steps of
preparing, based on said iconic representations and said one or more data pathways, a high-level database corresponding to said solution; and
translating said database into said behavioral representation.

4. The method of claim 1, further comprising visually highlighting a detected image component in said input image.

5. The method of claim 4, further comprising sending an event trigger signal when a combination of at least two image components is detected in said input image.

6. The method of claim 5, wherein said event trigger signal is sent based on a proximity between said at least two image components.

7. The method of claim 1, further comprising:
sending an output trigger signal in response to detecting said image components in an input image; and
in response to said trigger signal, highlighting said detected image components in said input image and forwarding a copy of the input image to a predetermined destination.

8. The method of claim 1, further comprising:
viewing said iconic representations in a graphical user interface;
replacing one of said iconic representations with a new iconic representation, wherein said new representation corresponds to a solution identifying the presence of a new image component;
generating a new behavioral representation using at least said new iconic representation; and
using said new behavioral representation to reconfigure said platform to detect the presence of at least said new image component in an input image.

9. A signals intelligence analysis system, comprising:
a reconfigurable hardware computing platform, said platform configured to execute a signals intelligence analysis solution;
a front end configured to receive input in real time;
a data storage medium, communicatively coupled to said front end, and configured to buffer said input, wherein said front end is configured to synchronously pass said input to said reconfigurable hardware computing platform at a frequency based on a complexity of said solution, and wherein said front end is configured to synchronously pass said input to said reconfigurable hardware at a limiting frequency of the most complex solution currently loaded into said hardware.

10. The system of claim 9, wherein said reconfigurable hardware platform is configured to execute using parallel circuitry.

11. The system of claim 9, wherein said front end is an analog front end, and includes a plurality of ports communicatively connected to a plurality of reconfigurable hardware computing platforms.

12. The system of claim 9, wherein said reconfigurable hardware computing platform includes a host computer and a gate array.

13. A signals intelligence analysis solution development system, comprising:
a computer having a display;
one or more memories storing computer-executable instructions that cause said computer to perform the following steps:
receive a user request to display a plurality of icons related by one ore more data pathways and event triggers, said icons corresponding to instructions for detecting the presence of a plurality of image objects in an input image;
generate a high-level database based on said icons, one or more pathways and event triggers; and
supply said database to a behavior generator, wherein said behavior generator translates said database into behavioral code used to configure a target platform to detect the presence of said plurality of image objects in an input image, and to issue an indication based on a proximity of said detected image objects.

14. The system of claim 13, wherein said behavioral code is in Register Transfer Logic format.

15. The system of claim 13, wherein said behavioral code lacks pre-defined input/output elements to allow downstream combination with other solutions.

16. The system of claim 13, further comprising a solution mixer configured to receive a plurality of sections of behavioral code, each section corresponding to a solution, and to restructure said plurality of sections of behavioral code into a single monolithic code.

17. The system of claim 16, wherein said solution mixer creates one or more input/output elements for said solutions.

18. The system of claim 17, wherein said input/output elements include computer code for communicating with a target reconfigurable hardware computing platform.

19. The system of claim 17, wherein said input/output elements include computer code for communicating with an analog front end.

20. The system of claim 16, wherein said solution mixer creates one or more data pipelines between said solutions.

21. The system of claim 16, wherein said solution mixer adds additional code for preventing unauthorized execution.

22. The system of claim 16, further comprising a reconfigurable hardware computing platform, wherein said monolithic block of code is used to configure said reconfigurable hardware computing platform to execute a solution based on said block of code.

* * * * *

UNITED STATES PATENT AND TRADEMARK OFFICE
CERTIFICATE OF CORRECTION

PATENT NO.         : 7,386,833 B2                                              Page 1 of 1
APPLICATION NO.    : 10/653998
DATED              : June 10, 2008
INVENTOR(S)        : Nicola V. Granny et al.

It is certified that error appears in the above-identified patent and that said Letters Patent is hereby corrected as shown below:

In Column 50, Claim 16, Line 37:
    Please replace "monolithic code." with --monolithic block of code.--

Signed and Sealed this

Twenty-third Day of June, 2009

JOHN DOLL
*Acting Director of the United States Patent and Trademark Office*